(12) United States Patent
Tu et al.

(10) Patent No.: US 10,424,666 B2
(45) Date of Patent: Sep. 24, 2019

(54) LEADFRAME AND INTEGRATED CIRCUIT CONNECTION ARRANGEMENT

(71) Applicant: Silanna Asia Pte Ltd, Singapore (SG)

(72) Inventors: Shanghui Larry Tu, San Diego, CA (US); Michael A. Stuber, Rancho Santa Fe, CA (US); Befruz Tasbas, San Diego, CA (US); Stuart B. Molin, Carlsbad, CA (US); Raymond Jiang, Raleigh, NC (US)

(73) Assignee: Silanna Asia Pte Ltd, Singapore (SG)

( * ) Notice: Subject to any disclaimer, the term of this patent is extended or adjusted under 35 U.S.C. 154(b) by 0 days.

(21) Appl. No.: 15/680,034

(22) Filed: Aug. 17, 2017

(65) Prior Publication Data

US 2018/0240740 A1    Aug. 23, 2018

Related U.S. Application Data

(60) Provisional application No. 62/461,117, filed on Feb. 20, 2017.

(51) Int. Cl.
*H01L 29/786* (2006.01)
*H01L 29/10* (2006.01)
(Continued)

(52) U.S. Cl.
CPC ........ *H01L 29/786* (2013.01); *H01L 21/4825* (2013.01); *H01L 21/4853* (2013.01);
(Continued)

(58) Field of Classification Search
CPC ... H01L 23/481; H01L 21/4853; H01L 24/48; H01L 24/32; H01L 2224/48247; H01L 2224/73265; H01L 2224/32245
See application file for complete search history.

(56) References Cited

U.S. PATENT DOCUMENTS 4,738,936 A    4/1988  Rice
5,365,102 A   11/1994  Mehrotra et al.
(Continued)

FOREIGN PATENT DOCUMENTS

DE         19647324 A1    5/1997
KR       20100087115 A    8/2010
(Continued)

OTHER PUBLICATIONS

Office Action dated Dec. 15, 2017 for U.S. Appl. No. 15/640,081.
Notice of Allowance dated Nov. 9, 2017 for U.S. Appl. No. 15/588,357.
Office Action dated Sep. 5, 2017 for U.S. Appl. No. 15/588,357.
Notice of Allowance dated May 29, 2018 for U.S. Appl. No. 15/640,081.
(Continued)

*Primary Examiner* — Julia Slutsker
(74) *Attorney, Agent, or Firm* — MLO, a professional corp.

(57) ABSTRACT

A semiconductor package includes a leadframe having perimeter package leads and electrical connectors, a single semiconductor die having a back-side electrical contact and front-side electrical contacts, an electrically conductive clip ("clip"), and a top semiconductor die having a frontside and a backside. The single semiconductor die includes two or more transistors. Two or more of the front-side electrical contacts of the semiconductor die are electrically coupled to and physically mounted to respective electrical contacts of the leadframe. An electrical contact surface of the clip is electrically coupled to and physically mounted to an electrical connector of the leadframe. Another electrical contact surface of the clip is physically mounted to and electrically coupled to the back-side electrical contact of the semiconductor die. The backside of the top semiconductor die is physically mounted to yet another surface of the electrically conductive clip.

23 Claims, 11 Drawing Sheets

(51) Int. Cl.

| | | |
|---|---|---|
| *H01L 27/12* | (2006.01) | |
| *H01L 29/78* | (2006.01) | |
| *H01L 29/06* | (2006.01) | |
| *H01L 21/84* | (2006.01) | |
| *H01L 21/74* | (2006.01) | |
| *H01L 29/66* | (2006.01) | |
| *H01L 21/48* | (2006.01) | |
| *H01L 21/768* | (2006.01) | |
| *H01L 23/48* | (2006.01) | |
| *H01L 23/495* | (2006.01) | |
| *H01L 23/00* | (2006.01) | |
| *H01L 29/417* | (2006.01) | |
| *H01L 23/522* | (2006.01) | |
| *H01L 23/535* | (2006.01) | |
| *H01L 25/00* | (2006.01) | |
| *H01L 23/485* | (2006.01) | |

(52) U.S. Cl.
CPC ...... *H01L 21/743* (2013.01); *H01L 21/76898* (2013.01); *H01L 21/84* (2013.01); *H01L 23/481* (2013.01); *H01L 23/4951* (2013.01); *H01L 23/49513* (2013.01); *H01L 23/49517* (2013.01); *H01L 23/49524* (2013.01); *H01L 23/49541* (2013.01); *H01L 23/49568* (2013.01); *H01L 23/49575* (2013.01); *H01L 23/5225* (2013.01); *H01L 23/535* (2013.01); *H01L 24/40* (2013.01); *H01L 24/41* (2013.01); *H01L 24/49* (2013.01); *H01L 24/73* (2013.01); *H01L 24/84* (2013.01); *H01L 25/50* (2013.01); *H01L 27/1203* (2013.01); *H01L 27/1207* (2013.01); *H01L 29/0649* (2013.01); *H01L 29/1087* (2013.01); *H01L 29/1095* (2013.01); *H01L 29/41766* (2013.01); *H01L 29/66659* (2013.01); *H01L 29/66681* (2013.01); *H01L 29/66696* (2013.01); *H01L 29/7816* (2013.01); *H01L 29/7824* (2013.01); *H01L 29/7835* (2013.01); *H01L 23/485* (2013.01); *H01L 23/49562* (2013.01); *H01L 24/32* (2013.01); *H01L 24/48* (2013.01); *H01L 2224/32245* (2013.01); *H01L 2224/4001* (2013.01); *H01L 2224/40141* (2013.01); *H01L 2224/40245* (2013.01); *H01L 2224/48091* (2013.01); *H01L 2224/48108* (2013.01); *H01L 2224/48247* (2013.01); *H01L 2224/73213* (2013.01); *H01L 2224/73265* (2013.01)

(56) References Cited

U.S. PATENT DOCUMENTS

| | | |
|---|---|---|
| 5,378,912 A | 1/1995 | Pein |
| 5,382,818 A | 1/1995 | Pein |
| 5,521,414 A | 5/1996 | Palara |
| 5,548,150 A | 8/1996 | Omura et al. |
| 5,559,044 A | 9/1996 | Williams et al. |
| 5,773,852 A | 6/1998 | Han et al. |
| 5,869,875 A | 2/1999 | Hebert |
| 5,889,310 A | 3/1999 | Terashima et al. |
| 6,025,237 A | 2/2000 | Choi |
| 6,049,108 A | 4/2000 | Williams et al. |
| 6,078,090 A | 6/2000 | Williams et al. |
| 6,084,284 A | 7/2000 | Adamic |
| 6,294,838 B1 | 9/2001 | Peng |
| 6,476,442 B1 | 11/2002 | Williams et al. |
| 6,692,998 B2 | 2/2004 | Maciejewski et al. |
| 6,794,719 B2 | 9/2004 | Petruzzello et al. |
| 7,008,821 B1 | 3/2006 | Shao et al. |
| 7,235,845 B2 | 6/2007 | Xu et al. |
| 7,273,771 B2 | 9/2007 | Kinzer |
| 7,282,765 B2 | 10/2007 | Xu et al. |
| 7,420,247 B2 | 9/2008 | Xu et al. |
| 7,446,375 B2 | 11/2008 | Xu et al. |
| 7,560,808 B2 | 7/2009 | Korec et al. |
| 7,576,388 B1 | 8/2009 | Wilson et al. |
| 7,589,378 B2 | 9/2009 | Kocon et al. |
| 7,598,128 B2 | 10/2009 | Hsu et al. |
| 7,629,645 B2 | 12/2009 | Montanini et al. |
| 7,713,821 B2 | 5/2010 | Hsu et al. |
| 7,719,054 B2 | 5/2010 | Williams et al. |
| 7,745,846 B2 | 6/2010 | Korec et al. |
| 7,745,920 B2 | 6/2010 | Lee et al. |
| 7,829,947 B2 | 11/2010 | Hébert |
| 7,842,568 B2 | 11/2010 | Anderson et al. |
| 7,952,145 B2 | 5/2011 | Korec et al. |
| 8,101,993 B2 | 1/2012 | Hsieh |
| 8,198,154 B2 | 6/2012 | Hebert |
| 8,674,440 B2 | 3/2014 | Korec et al. |
| 8,847,310 B1 | 9/2014 | Korec |
| 8,928,116 B2 | 1/2015 | Korec et al. |
| 8,994,105 B2 | 3/2015 | Korec |
| 8,994,115 B2 | 3/2015 | Korec et al. |
| 9,159,825 B2 | 10/2015 | Molin et al. |
| 9,324,838 B2 | 4/2016 | Cascino et al. |
| 9,349,677 B2 | 5/2016 | Cho et al. |
| 9,373,571 B2 | 6/2016 | Denison et al. |
| 9,412,881 B2 | 8/2016 | Korec et al. |
| 9,412,911 B2 | 8/2016 | Atankackovic |
| 9,466,536 B2 | 10/2016 | Goktepeli et al. |
| 9,524,957 B2 | 12/2016 | Hebert et al. |
| 9,530,796 B2 | 12/2016 | Stuber et al. |
| 9,583,477 B2 | 2/2017 | Cho et al. |
| 9,589,929 B2 | 3/2017 | Terrill et al. |
| 10,083,897 B2 | 9/2018 | Tu et al. |
| 2002/0017697 A1 | 2/2002 | Kitamura et al. |
| 2003/0094654 A1 | 5/2003 | Christensen et al. |
| 2004/0201061 A1 | 10/2004 | Jeon et al. |
| 2004/0238913 A1 | 12/2004 | Kwon et al. |
| 2004/0245633 A1 | 12/2004 | Alter et al. |
| 2006/0001110 A1 | 1/2006 | Igarashi |
| 2006/0261382 A1 | 11/2006 | Khemka et al. |
| 2007/0034942 A1 | 2/2007 | Xu et al. |
| 2007/0080431 A1 | 4/2007 | Hung et al. |
| 2007/0108469 A1 | 5/2007 | Nakano et al. |
| 2007/0138548 A1 | 6/2007 | Kocon et al. |
| 2007/0235769 A1 | 10/2007 | Rosa et al. |
| 2008/0012043 A1 | 1/2008 | Udrea et al. |
| 2008/0023785 A1 | 1/2008 | Hebert |
| 2008/0038912 A1 | 2/2008 | Hess et al. |
| 2008/0122006 A1 | 5/2008 | Williams et al. |
| 2008/0150094 A1 | 6/2008 | Anderson |
| 2008/0197411 A1 | 8/2008 | Korec et al. |
| 2008/0246086 A1 | 10/2008 | Korec et al. |
| 2008/0315304 A1 | 12/2008 | Hsu et al. |
| 2009/0179264 A1 | 7/2009 | Korec et al. |
| 2009/0273029 A1 | 11/2009 | Tien et al. |
| 2010/0002374 A1 | 1/2010 | Sasagawa et al. |
| 2010/0025763 A1 | 2/2010 | Paul et al. |
| 2010/0127347 A1 | 5/2010 | Quinn |
| 2010/0171543 A1 | 7/2010 | Korec et al. |
| 2010/0237414 A1 | 9/2010 | Hsieh |
| 2010/0301413 A1 | 12/2010 | You |
| 2010/0314683 A1 | 12/2010 | Yanagi |
| 2010/0315159 A1 | 12/2010 | Kocon et al. |
| 2011/0024839 A1 | 2/2011 | Zinn et al. |
| 2011/0084314 A1 | 4/2011 | Or-Bach et al. |
| 2011/0127602 A1 | 6/2011 | Mallikarjunaswamy |
| 2011/0148376 A1 | 6/2011 | Xu et al. |
| 2011/0148506 A1 | 6/2011 | Korec et al. |
| 2011/0198927 A1 | 8/2011 | Korec et al. |
| 2011/0241170 A1 | 10/2011 | Haeberlen et al. |
| 2011/0292632 A1 | 12/2011 | Wen et al. |
| 2011/0303976 A1 | 12/2011 | Kocon et al. |
| 2011/0309438 A1 | 12/2011 | Ichijo et al. |
| 2012/0012982 A1 | 1/2012 | Korec et al. |
| 2012/0032262 A1 | 2/2012 | Toren et al. |
| 2012/0181681 A1 | 7/2012 | Cho et al. |
| 2012/0220091 A1 | 8/2012 | Challa et al. |
| 2012/0299119 A1 | 11/2012 | Xue et al. |

(56) References Cited

U.S. PATENT DOCUMENTS

| | | | |
|---|---|---|---|
| 2013/0009253 | A1 | 1/2013 | Wang et al. |
| 2014/0002935 | A1 | 1/2014 | Chen et al. |
| 2014/0035047 | A1 | 2/2014 | Korec et al. |
| 2014/0061884 | A1 | 3/2014 | Carpenter et al. |
| 2014/0167269 | A1 | 6/2014 | Lu et al. |
| 2014/0210107 | A1 | 7/2014 | Zhai |
| 2014/0264611 | A1 | 9/2014 | Lee et al. |
| 2014/0273344 | A1 | 9/2014 | Terrill et al. |
| 2016/0064361 | A1 | 3/2016 | Denison et al. |
| 2017/0221885 | A1 | 8/2017 | Sander et al. |

FOREIGN PATENT DOCUMENTS

| | | | |
|---|---|---|---|
| KR | 20130119439 | A | 10/2013 |
| TW | 200805510 | A | 1/2008 |
| TW | 201133856 | A | 10/2011 |
| WO | 2003036699 | A3 | 9/2003 |

OTHER PUBLICATIONS

Notice of Allowance dated Sep. 26, 2018 for U.S. Appl. No. 15/853,357.

Nenadovic, et al., "RF Power Silicon-On-Glass VDMOSFETs," IEEE, vol. 25, No. 6, Jun. 2004, pp. 424-426.

Nenadovic, et al., "VDMOS and LDMOS transistors for RF-power applications," ResearchGate, Nov. 2002, pp. 61-68.

Yuanzheng Zhu et al., "Folded Gate LDMOS Transistor with Low On-Resistance and High Transconductance," IEEE vol. 48, No. 12, Dec. 2001, pp. 2917-28.

International Search Report dated May 16, 2018 for PCT Patent Application Nu. PCT/IB2018/050905.

International Search Report dated May 21, 2018 for PCT Patent Application Nu. PCT/IB2018/050907.

International Search Report dated May 21, 2018 for PCT Patent Application Nu. PCT/IB2018/050909.

Notice of Allowance dated Jun. 19, 2019 for U.S. Appl. No. 16/252,168.

Office Action dated Jun. 24, 2019 for U.S. Appl. No. 16/137,300.

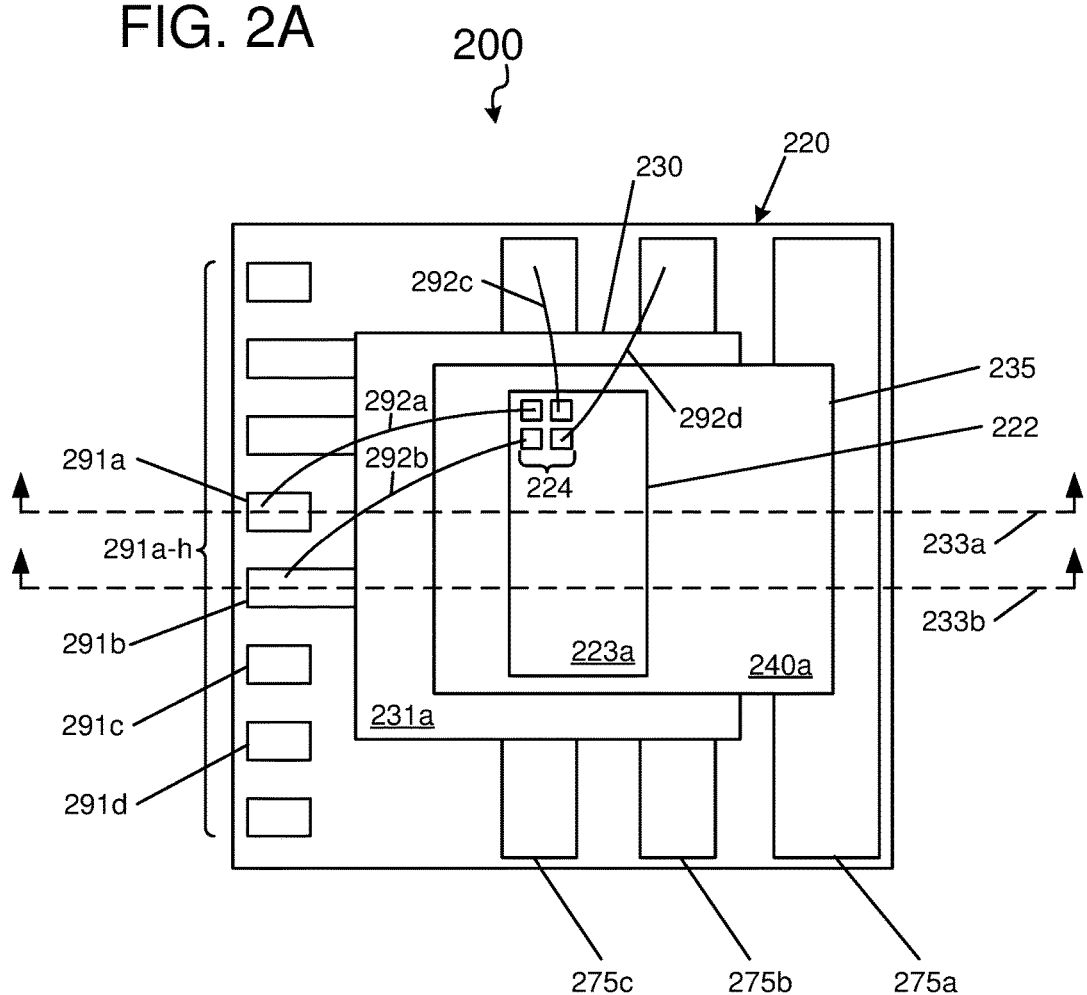

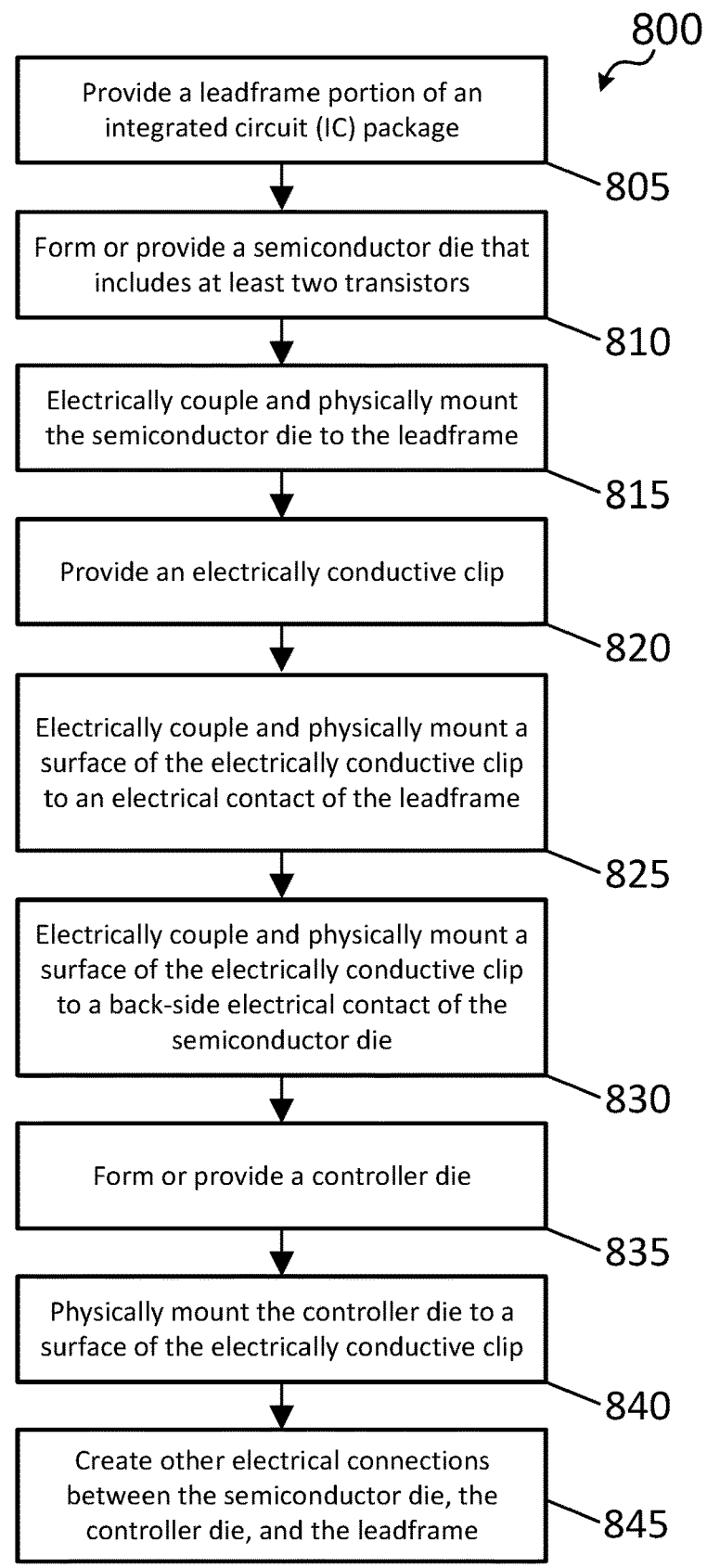

LEADFRAME AND INTEGRATED CIRCUIT CONNECTION ARRANGEMENT

CROSS-REFERENCE TO RELATED APPLICATION

This application claims the benefit of U.S. Provisional Application No. 62/461,117, filed Feb. 20, 2017 and entitled "Backside Contact Integrated Laterally Diffused MOS Apparatus and Methods," all of which is incorporated by reference herein in its entirety.

BACKGROUND

Semiconductor power devices are specialized devices that typically are used as switches or rectifiers in power electronics circuits. Semiconductor power devices are characterized by their ability to withstand high voltages and large currents as well as the high temperatures associated with high power operation. For example, a switching voltage regulator typically includes two power devices that constantly switch on and off in a synchronized manner to regulate a voltage. The power devices in this situation need to sink system-level current in the on state, withstand the full potential of the power supply in the off state, and dissipate a large amount of heat. The ideal power device is able to operate in high power conditions, can rapidly switch between on and off states, and exhibits low thermal and on-state resistance.

A typical semiconductor power device package includes a set of discrete power transistors each of which is fabricated on its own respective semiconductor die. The individual dice are encapsulated in an insulating mold compound with a leadframe that provides external electrical connections for individual devices or integrated circuits formed in the semiconductor dice.

High power semiconductor applications, such as power switching and power handling, require electrical connections between the semiconductor die pads and the package leads that are characterized by high current carrying capacity, low resistance, and/or low inductance. For these reasons, efforts have been made to use electrically conductive ribbon or pre-formed clips composed of copper, copper alloy, or aluminum instead of bond wires for high power electrical connections within semiconductor packages. Electrically conductive clips, however, are physically large and difficult to mechanically position on a chip with high accuracy.

In a typical semiconductor power device package, each discrete power transistor semiconductor die is electrically connected to the package with a single front-side high-current package lead, a single front-side low-current package lead for gate control, and a backside connection to a package paddle. With only a single high-current front-side connection per semiconductor die, electrically conductive clips readily can be used for the front-side connections in these types of package arrangements without compromising manufacturability or performance.

Power devices may be implemented using lateral diffusion field effect transistors (LDFETs), such as lateral diffusion metal oxide semiconductor (LDMOS) transistors. These types of transistors are characterized by a "lateral diffusion" region (or low-doped or lightly-doped drain (LDD) region) that corresponds to an extension of the drain region that is less strongly doped than the core drain region and that extends laterally away from the channel. The lateral diffusion region increases an LDFET's ability to handle higher voltages in the off-state by absorbing portions of the electric field that would otherwise cause source-drain punch-through and to handle larger currents in the on-state by preventing a large potential drop from building up at the drain-body interface which would otherwise result in degradation of the device via the injection of hot carriers into the body of the device.

Lateral power devices, such as LDFETs, typically have front-side source and drain contacts, each of which typically has its own high current, low resistance, and/or low inductance front-side electrical connection. The need for both external (e.g., package) and on-chip electrical connections increases with the number of lateral power devices that are integrated on the same semiconductor die. The front-side of a semiconductor die, however, has limited space available to accommodate the relatively large sizes of high performance electrical connections. This limitation severely restricts circuit design flexibility, performance, and manufacturability of integrated lateral power device circuits.

SUMMARY

In some embodiments, an integrated circuit (IC) package includes a leadframe that has perimeter package leads, a first electrical connector, a second electrical connector, and a third electrical connector. The IC package additionally includes a single semiconductor power die having a frontside and a backside. The backside of the semiconductor power die has a back-side electrical contact, the frontside has a first front-side electrical contact, and a second front-side electrical contact. The first front-side electrical contact is electrically coupled to and physically mounted to the first electrical connector, and the second front-side electrical contact is electrically coupled to and physically mounted to the second electrical connector. The IC package also includes an electrically conductive clip that has a first electrical contact surface, a second electrical contact surface and a third electrical contact surface. The second electrical contact surface and the third electrical contact surface are on opposite sides of a portion of the electrically conductive clip. The first electrical contact surface is electrically coupled to and physically mounted to the third electrical connector, and the second electrical contact surface is electrically coupled to and physically mounted to the back-side electrical contact of the single semiconductor power die. The IC package also includes a controller die that has a controller frontside, a controller backside, and a controller back-side electrical contact. The controller backside is physically mounted to the third electrical contact surface of the electrically conductive clip.

In some embodiments, a method for packaging a semiconductor device in an IC package involves providing a leadframe having perimeter package leads, a first electrical connector, a second electrical connector, and a third electrical connector. A single semiconductor power die having a frontside and a backside is formed. The semiconductor power die backside has a back-side electrical contact, and the frontside has a first front-side electrical contact and a second front-side electrical contact. The method includes electrically coupling and physically mounting the first front-side electrical contact to the first electrical connector, and electrically coupling and physically mounting the second front-side electrical contact to the second electrical connector. An electrically conductive clip is provided that has a first electrical contact surface, a second electrical contact surface and a third electrical contact surface. The second electrical contact surface and the third electrical contact surface are on opposite sides of a portion of the electrically conductive clip.

The method includes electrically coupling and physically mounting the first electrical contact surface to the third electrical connector of the leadframe and electrically coupling and physically mounting the second electrical contact surface of the electrically conductive clip to the back-side electrical contact of the single semiconductor power die. A controller die that has a controller frontside, a controller backside and a controller back-side electrical contact is provided. The controller backside of the controller die is physically mounted to the third electrical contact surface of the electrically conductive clip.

DESCRIPTION OF DRAWINGS

FIG. 2A is a diagrammatic top orthographic view of a simplified example of a portion of an integrated circuit package, in accordance with some embodiments.

FIG. 8 shows a simplified example of a method for packaging a semiconductor device in an integrated circuit package having a leadframe, in accordance with some embodiments.

DETAILED DESCRIPTION

In the following description, like reference numbers are used to identify like elements. Furthermore, the drawings are intended to illustrate major features of example embodiments in a diagrammatic manner. The drawings are not intended to depict every feature of actual embodiments nor relative dimensions of the depicted elements, and are not drawn to scale.

Some examples described herein provide an advantageous electrically conductive clip arrangement for a flip chip oriented semiconductor device to facilitate electrical conductivity and heat extraction for an integrated circuit package. The integrated circuit package includes a controller die, as well as two or more power transistors which are within a single semiconductor die. Some examples of the integrated circuit package included herein include embodiments where the controller die is mounted directly to the electrically conductive clip ("clip") such that an electrical contact of the controller die is electrically coupled to the clip (e.g. the clip is coupled to a ground node of the integrated circuit package and a ground node of the controller die is electrically coupled to the clip). In other examples, the controller die is mounted directly to the clip, but the controller die is substantially electrically isolated from the clip.

Examples of semiconductor dice provided herein include integrated lateral diffusion field effect transistor (LDFET) circuits formed on semiconductor dice that include at least one substrate contact to a backside electrical connection that reduces the number of required front-side electrical connections. In this way, these examples increase the front-side space available for accommodating the relatively large sizes of high performance electrical connections (e.g. electrical connectors of a leadframe, such as metal strips capable of conducting high currents), thereby increasing circuit design flexibility, performance, and manufacturability of integrated LDFET power device circuits. In some examples, an LDFET that has a substrate contact is electrically isolated from other LDFETs in the same circuit to further improve the performance of the circuit by preventing the formation of a common node between the LDFETs that are connected to the substrate and those that are not.

Figure 1:
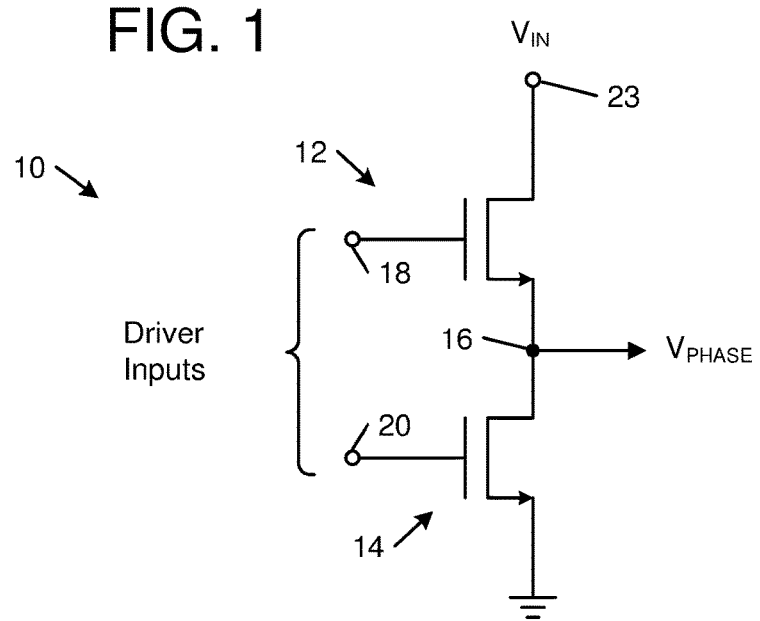
FIG. 1 is a circuit diagram of an example of a high power semiconductor switch incorporating some embodiments.

For illustrative purposes only, this disclosure describes specific examples of single-semiconductor die integrated LDFET circuits in the context of embodiments similar to an example high power semiconductor switch circuit 10 shown in FIG. 1. The same or similar teachings may be used to fabricate other single-semiconductor die integrated LDFET circuits that are suitable for both power and non-power applications.

The high power semiconductor switch circuit 10 includes a high-side field effect transistor (FET) 12 and a low-side FET 14. The source of the high-side FET 12 is coupled to the drain of the low-side FET 14 at a phase node 16 ($V_{PHASE}$). The driver input terminals 18, 20 control the duty cycles of the high-side FET 12 and the low-side FET 14 to convert the input voltage ($V_{IN}$) at the input node 23 to a particular output voltage ($V_{PHASE}$) at the phase node 16. In general, the FETs 12, 14 may be fabricated using any of a wide variety of semiconductor material systems and technologies, including silicon, germanium, and compound semiconductor technologies.

FIG. 2A shows a top orthographic view of a simplified example of a portion of an integrated circuit (IC) package 200 that includes a leadframe 220, a semiconductor die 230, an electrically conductive clip 235, and a top semiconductor die (e.g., a controller die 222) in accordance with some embodiments. In some embodiments, the top semiconductor die is one of: (i) a controller die, (ii) a bulk semiconductor die, (iii) a microprocessor, (iv) a microcontroller, (v) a digital signal processor, or (vi) another semiconductor as is known in the art. In the example embodiments described herein, the top semiconductor die is a controller die (controller die 222). The IC package 200 also includes bondwires 292a-d. In the example shown, the semiconductor die 230 embodies an integrated point-of-load (POL) voltage converter and the controller die 222 is configured to synchronize the respective on/off states of transistors of the POL voltage converter. In the simplified example shown, the semiconductor die 230 embodies an example implementation of the high power semiconductor switch circuit 10 shown in FIG. 1. However, the semiconductor device could be another semiconductor device as is known in the art.

Figure 2B:
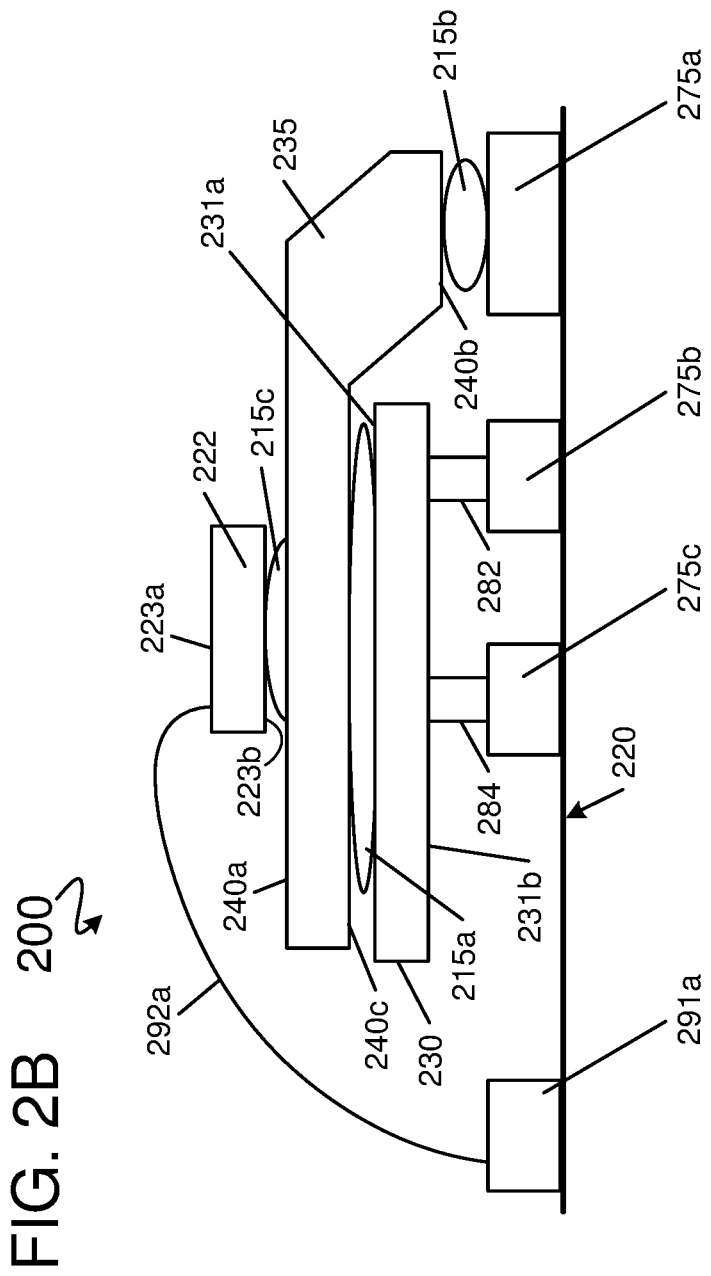
FIG. 2B is a diagrammatic cross-section of a simplified example of a portion of an integrated circuit package, in accordance with some embodiments.

As shown, the controller die 222 has a controller frontside 223a (as well as other sides, as shown in FIG. 2B) and controller front-side electrical contacts 224. The semiconductor die 230 has a backside 231a, as well as other sides, as shown in FIG. 2B. Similarly, the electrically conductive clip ("clip") 235 has an electrical contact surface 240a, as well as other electrical contact surfaces, as shown in FIG. 2B. Also shown are cross-section cutting lines 233a-b, which are discussed later with reference to FIGS. 2B-C.

In general, the leadframe 220 includes electrical connectors 275a-c and perimeter package leads 291a-h. The number of electrical connectors and/or perimeter package leads shown in FIG. 2A, or in any of the figures herein, are shown as a simplified example. In some embodiments, more or fewer electrical connectors and/or perimeter package leads may be used. As shown, an electrical contact surface of the clip 235, opposite the electrical contact surface 240a, is physically mounted to the backside 231a of the semiconductor die 230. A controller backside of the controller die 222, opposite the controller frontside 223a, is physically mounted to the electrical contact surface 240a of the clip 235. Respective electrical contacts (shown in FIG. 2B and FIG. 2C) of the frontside of the semiconductor die 230, opposite the backside 231a of the semiconductor die 230, are electrically coupled to and physically mounted to the electrical connectors 275b-c of the leadframe.

One or more of the front-side electrical contacts of the controller die 222 are electrically coupled to one or more of the perimeter package leads 291a-h, to the leadframe 220, and/or to the semiconductor die 230 to receive or send signals, commands and/or feedback for control of the electronic components, e.g., transistors, of the high power semiconductor switch circuit in the semiconductor die 230 described below. By way of example, a contact of the controller front-side electrical contacts 224 is coupled to the perimeter package lead 291a by the bond-wire 292a. Another contact of the controller front-side electrical contacts 224 is coupled to the perimeter package lead 291b by the bond-wire 292b, another to the electrical connector 275c by the bond-wire 292c, and still another to the electrical connector 275b by the bond-wire 292d.

The electrically conductive clip 235 is larger than the bond-wires 292a-d in at least one dimension. Thus, the electrically conductive clip 235 comparatively conducts a greater amount of heat, and has greater electrical conductivity than the bond-wires. By advantageously placing the electrically conductive clip 235 between the semiconductor die 230 and the controller die 222 (or other top semiconductor die), heat developed from either or both of these dice can be conducted by the electrically conductive clip 235 out, or to an outer perimeter, of the IC package 200.

Conductive clips, such as the electrically conductive clip 235, are often pre-formed (e.g. rather than deposited) using copper (Cu), are mechanically large as compared to a semiconductor die and/or as compared to bond wires, have greater structural strength compared to bond-wires, have greater electrical conductivity capabilities than bond-wires, and have greater thermal conductivity capabilities than bond-wires. For example, electrically conductive clips typically have a minimum feature size of about 100 μm and a substantial cross sectional area. As mentioned previously, the conductive clip 235 is advantageously placed in between, and is coupled to, the semiconductor die 230 and the controller die 222 to facilitate heat transport away from those parts.

FIG. 2B shows a diagrammatic cross-section view of a portion of the simplified example integrated circuit (IC) package 200 including the leadframe 220 for a semiconductor device, in accordance with some embodiments. The cross-section view of the IC package 200 is a cross-section taken through a portion of the IC package 200 of FIG. 2A indicated by the cutting line 233a of FIG. 2A.

The IC package 200 of FIG. 2B includes the elements introduced in FIG. 2A, as well as mounting mediums 215a-c, a controller backside 223b, a frontside 231b of the semiconductor die 230, and electrical contact surfaces 240b-c of the clip 235.

The electrical contact surface 240b of the clip 235 is electrically coupled to and physically mounted to the electrical connector 275a by the mounting medium 215b. The electrical contact surface 240c of the clip 235 is electrically coupled to and physically mounted to the backside 231a of the semiconductor die 230 by the mounting medium 215a. In some embodiments, the mounting mediums 215a-c include die attach adhesive, sintered silver, solder paste, thermally conductive adhesive, or any substance suitable for forming physical, thermal and electrical connections. As will be described, in some embodiments, the mounting medium 215c is an electrically insulating material. In some embodiments, the front-side electrical contacts of the semiconductor die 230 include copper pillars or solder bumps. The first front-side electrical contact 282 of the semiconductor die 230 is electrically coupled to and physically mounted to the electrical connector 275b, and the second front-side electrical connector 284 is electrically coupled to and is physically mounted to the electrical connector 275c (e.g. by a die-attach adhesive or other suitable mounting technique). The bond-wire 292a electrically couples the perimeter package lead 291a (e.g. of the perimeter package leads 291a-h of FIG. 2A) to a controller front-side electrical contact of the controller die 222.

In some embodiments, the first front-side electrical contact 282 and the second front-side electrical contact 284 of the semiconductor die 230 generally represent top metal layers of multiple metal layers of the semiconductor die 230. The semiconductor die 230 is inverted or in a flip-chip configuration, so the "top"/"frontside" and the "bottom"/"backside" of the semiconductor die 230 are shown on the bottom and top, respectively, in the drawing. Some metal layers, connections, bond-wires, or other features have been omitted for simplicity. Intervening metal layers, conductive adhesive, copper pillars, solder bumps, or other metal bonding structures may be present. In some embodiments, at least five electrical connections are made between the semiconductor die 230, the leadframe 220, and/or the controller die 222. With reference to FIG. 1, these five electrical connections include an electrical connection to the input node 23 ($V_{IN}$), an electrical connection to the phase node 16 ($V_{PHASE}$), an electrical connection to the ground node, an electrical connection to the driver input terminal 18 (e.g. a gate node of the high-side FET 12), and an electrical connection to the driver input terminal 20 (e.g. a gate node of the low-side FET 14).

In some embodiments, a back-side electrical contact on the controller backside 223b of the controller die 222 is electrically coupled to the electrical contact surface 240a of the clip 235 by the mounting medium 215c, which is a die attach adhesive, sintered silver, solder paste, thermally conductive adhesive, or any substance suitable for forming physical, thermal and electrical connections. In other embodiments, the back-side electrical contact on the controller backside 223b of the controller die 222 is substantially electrically isolated from the electrical contact surface 240a of the clip 235 by the mounting medium 215c, which is a die attach adhesive or any substance suitable for forming physical and thermal connections. In either embodiment, heat generated by the semiconductor die 230 and the controller die 222 is advantageously conducted (through the mounting medium 215a,c, the clip 235, and the mounting medium 215b) to an exterior facing portion of the IC package 200 (e.g. to the electrical connector 275a).

Figure 2C:
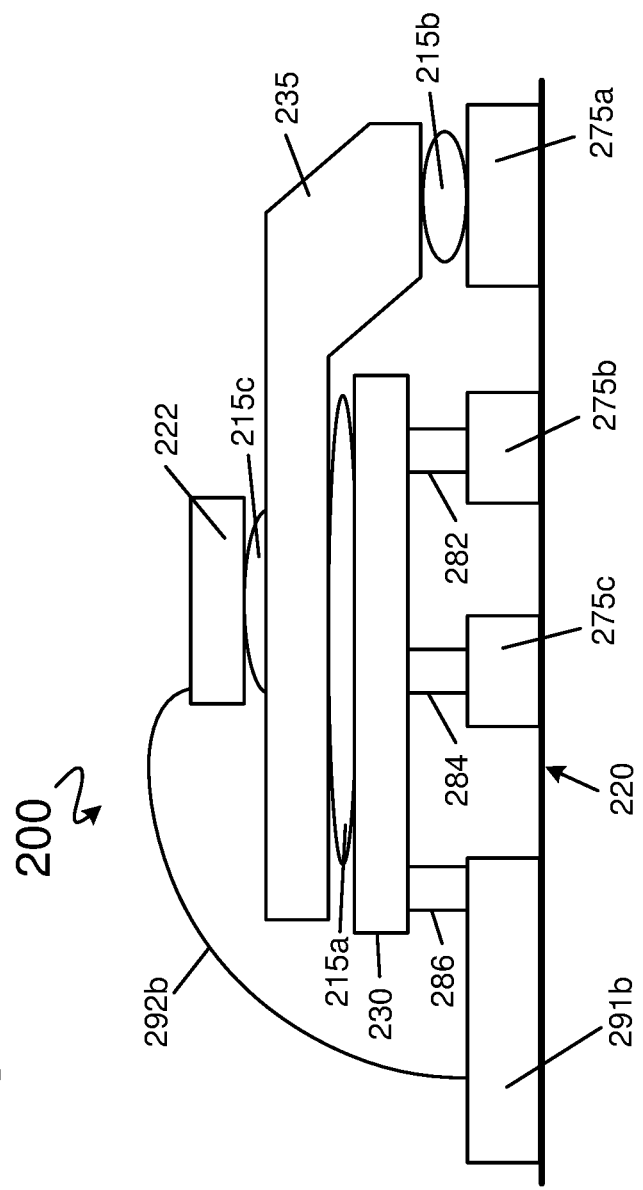
FIG. 2C is a diagrammatic cross-section of a simplified example of a portion of an integrated circuit package, in accordance with some embodiments.

FIG. 2C shows a diagrammatic cross-section view of a portion of the simplified example integrated circuit (IC) package 200 including the leadframe 220 for a semiconductor device, in accordance with some embodiments. The cross-section view of the IC package 200 shown in FIG. 2C is a cross-section taken through a portion of the IC package 200 of FIG. 2A indicated by the cutting line 233b of FIG. 2A.

The IC package 200 of FIG. 2C includes the elements introduced in FIGS. 2A-B, as well as a third front-side electrical contact 286 of the semiconductor die 230. In some embodiments, the third front-side electrical contact 286 is electrically coupled to a gate contact of a transistor of the semiconductor die 230. As shown, the third front-side electrical contact 286 is electrically coupled to and physically mounted to the perimeter package lead 291b, which extends under the semiconductor die 230. Though the third front-side contact 286 is shown as being physically mounted to the perimeter package lead 291b, in some embodiments, the third front-side electrical contact 286 is electrically coupled to the perimeter package lead 291b (e.g. by bond-wire) but is not physically mounted to the perimeter package lead 291b.

In the embodiment shown, the bond-wire 292b electrically couples the perimeter package lead 291b to a controller front-side electrical contact of the controller die 222 and thereby electrically couples the third front-side contact 286 to a contact of the controller die 222.

In some embodiments, the third front-side electrical contact 286 generally represents a top metal layer of multiple metal layers of the semiconductor die 230. Some metal layers, connections, bond-wires, or other features have been omitted for simplicity. Intervening metal layers, conductive adhesive, copper pillars, solder bumps, or other metal bonding structures may be present.

Figure 3:
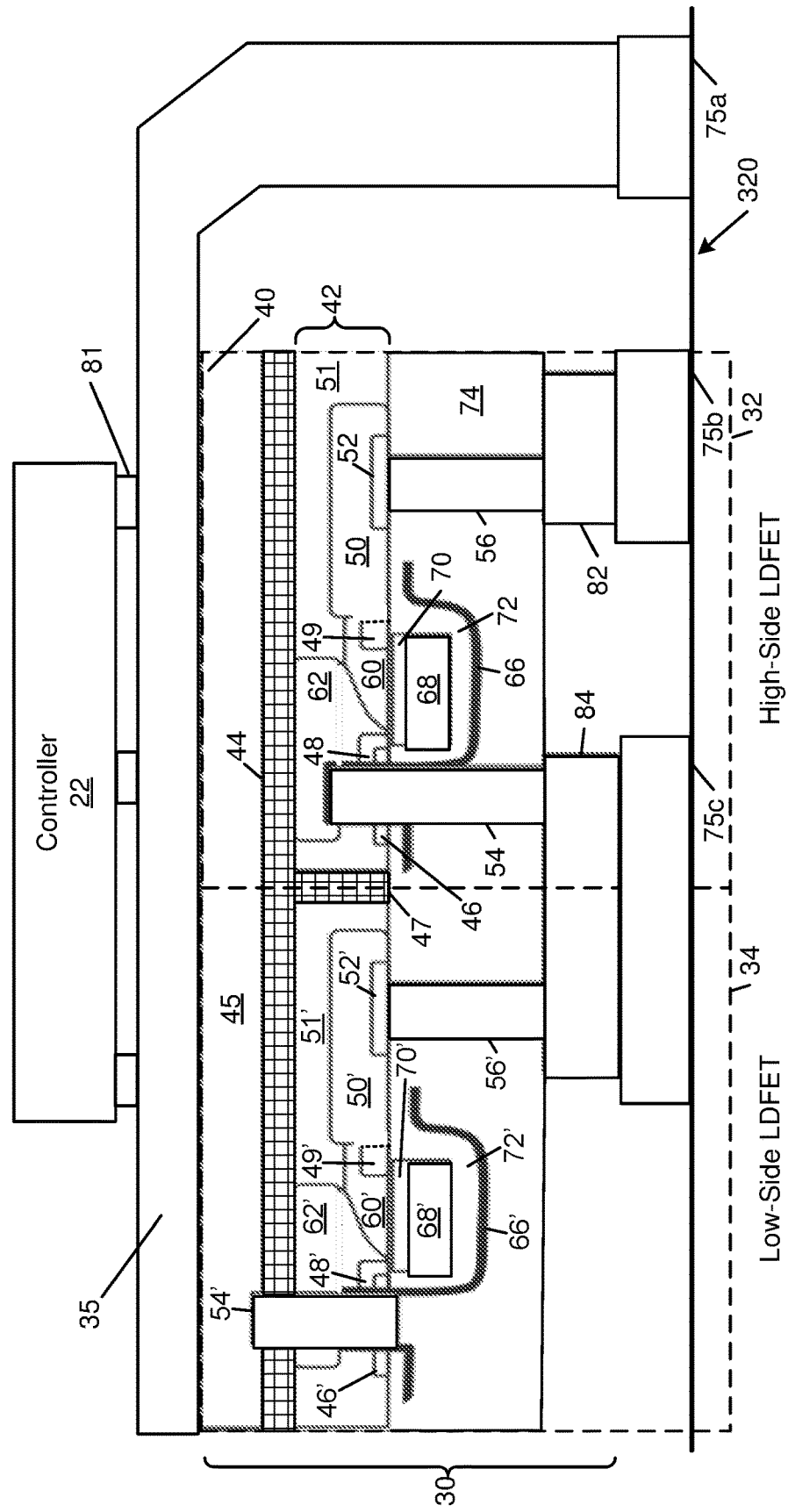
FIG. 3 is a diagrammatic cross-section of a simplified example of a portion of an integrated circuit package, in accordance with some embodiments.

FIG. 3 shows a simplified diagrammatic cross-sectional side view of a portion of an integrated circuit (IC) package 300 including a leadframe 320, in accordance with some embodiments. The portion of the leadframe 320 shown generally includes electrical connectors 75a-c. Other portions of the leadframe 320 have been omitted for simplicity. For example, perimeter package leads similar to the perimeter package leads 291a-h of FIG. 2A may be part of the leadframe 320. The IC package 300 includes a semiconductor die 30 having a first front-side electrical contact 82, and a second front-side electrical contact 84. The IC package 300 also includes an electrically conductive clip ("clip") 35, and a controller die 22 having a back-side electrical contact 81. Portions of the IC package 300 are similar to portions of the IC packages 200 discussed with reference to FIGS. 2A-C. For example: the clip 35 is similar to the clip 235, and electrical connectors 75a-c are similar to the electrical connectors 275a-c.

In the simplified example embodiment shown, the semiconductor die 30 embodies the high power semiconductor switch circuit 10 of FIG. 1. In this example, a LDFET 32 implements the high-side FET 12 of the switch circuit 10, and a LDFET 34 implements the low-side FET 14 of the switch circuit 10. In one example configuration, the first front-side contact 82 of the high-side LDFET 32 corresponds to the input node 23 of the switch circuit 10, the second front-side contact 84 corresponds to the phase node 16 of the switch circuit 10, and a substrate contact 40 corresponds to the ground node of the switch circuit 10. In some embodiments, front-side electrical contacts of the controller die 22 (e.g. similar to the controller front-side contacts 224 shown in FIG. 2A) are electrically coupled to gate nodes of the LDFET 32 and/or the LDFET 34 via wire bonds and/or through the leadframe 320. This configuration enables the controller die 22 to control the on/off state of the high-side LDFET 32 and of the low-side LDFET 34. In some embodiments, the semiconductor die 30 includes a p-type high-side transistor and an n-type low-side transistor. In some embodiments, both the high-side transistor and the low-side transistor are switched simultaneously, either separately with two gate contacts, or together using a single gate contact (e.g. where the gate of the high-side transistor and the gate of the low-side transistor are electrically coupled to a single gate contact).

In the example implementation of the high power semiconductor switch circuit 10 described above and shown in FIG. 3, a drain contact 56 of the high-side LDFET 32 is connected to the input node 23, a source contact 54 of the high-side LDFET 32 and a drain contact 56' of the low-side LDFET 34 are both connected to the phase node 16, and a source contact 54' of the low-side LDFET 34 is connected to the ground node. As mentioned above, other node connection arrangements are possible. For example, these other connection arrangements include any connection arrangements between a first LDFET and a second LDFET that includes (i) a common node that electrically connects to a source of a first LDFET and a drain of a second LDFET, (ii) at least one of the drain of the first LDFET, the source of the second LDFET, and the common node is electrically connected to the semiconductor substrate, and (iii) at least two front-side contacts that are connected to at least two of the drain of the first LDFET, the source of the second LDFET, and the common node that are not electrically connected to the semiconductor substrate.

The high-side and low-side LDFETs 32, 34 are implemented in an active layer 42. The active layer 42 can be any of a doped portion of the bulk of a semiconductor wafer, a localized well formed in a larger doped portion of a semiconductor wafer, an active layer of a semiconductor-on-insulator (SOI) wafer, and a localized well formed in an SOI wafer. In the illustrated example, the active layer 42 is a thin film formed over a buried dielectric layer 44 on a SOI substrate 45. In the illustrated example, a dielectric isolation barrier 47 extends between the high-side and low-side LDFETs 32, 34 from the top of the active layer 42 to the buried dielectric layer 44. In some examples, the dielectric isolation barrier 47 is formed using a shallow trench isolation (STI) process.

The high-side LDFET 32 of the active layer 42 includes a source region 46 formed in a doped region 48, a lightly doped drain (LDD) region 50 with a heavier doped extension region 49 that are formed in a doped region 51, and drain region 52. The source region 46, the doped region 48, the LDD region 50, the extension region 49, and the drain region 52 can comprise doped semiconductor material formed by, for example, the implant of impurities into active layer 42. The doped semiconductor material of each region 46-52 has a similar conductivity type (e.g., n-type or p-type). Therefore, each region 46-52 can be formed by the same dopant species, such as through the implant of one kind of dopant atom. The LDD region 50 has a lower dopant concentration than the drain region 52 and may also have a lower dopant concentration than the source region 46. The LDD region 50 provides the LDFET with its superior performance as a power device in terms of its ability to hold off large voltages and not degrade while sinking large currents. The presence of LDD region 50 provides the LDFET with its characteristic of having asymmetric source and drain regions. In some approaches, LDD region 50 generally extends laterally at least twice as far from the drain region 52 as the doped region 48 extends from the source region 46.

The high-side LDFET portion of the active layer 42 also includes a body region 60 and a deep well region 62 that have a conductivity type that is opposite the conductivity type of the source, doped, LDD, extension, and drain regions 46-52. The deep well region 62 extends laterally underneath the source region 46 and the portion of body region 60 in which a channel forms. The deep well region 62 enhances the ability of the high-side LDFET 32 to withstand large voltages and serves to remove unwanted charge carriers from body region 60 to prevent a parasitic bipolar junction transistor from activating during the on state of the high-side LDFET 32.

Above the active layer 42, the high-side LDFET 32 includes a gate structure that includes a gate shield 66 and a gate electrode 68. The gate electrode 68 is electrically insulated from the active layer 42 and the gate shield 66 by dielectric material 70, 72, respectively. Source region 46 is electrically coupled to a source contact 54 that is connected to the second front-side electrical contact (phase) 84. Drain region 52 is electrically coupled to a drain contact 56 that is connected to the first front-side electrical contact (input) 82. Drain region 52 can be a highly doped drain region and can form an electrically conductive path between drain contact 56 and LDD region 50. Electrically insulating material 74 (e.g., an interlayer dielectric) electrically isolates the electrical components above the active layer 42. In general, the electrically insulating material 74 and the dielectric material 70, 72 may be the same or similar materials. In addition, in certain approaches, the combination of insulating material 74 and dielectric material 70, 72 can be conceptualized as a single insulating layer in the finished device regardless of when and how they are formed.

A conductive path is formed between source contact 54 and drain contact 56 in response to the application of a voltage to gate electrode 68 (e.g. by the controller die 22). The conductive path between source contact 54 and drain contact 56 includes a channel that is selectively formed in body region 60 under the influence of the aforementioned voltage applied to gate electrode 68. While the channel is formed, the transistor is said to be on. While the channel is not formed, and there is no conductive path between source contact 54 and drain contact 56, the transistor is said to be off. There is no conductive path in this situation because source region 46 and drain regions 50, 52 have an opposite conductivity type to body region 60 such that diode junctions are formed at their interfaces.

The gate shield 66 is in ohmic contact with the source contact 54. The gate shield 66 is another feature that makes the high-side FET 32 more amenable to high power applications. By biasing the gate shield 66 to a given voltage, high power signals on drain contact 56 are shielded from having an appreciable effect on the gate region. Although the gate shield 66 is illustrated as being ohmically coupled to the source contact 54, the gate shield 66 can also be independently biased. In some examples, the gate shield 66 and the source contact 54 can be formed in two different steps and can comprise two different kinds of material. In this case, however, such features are inconsequential to the operation of the device in most situations because the gate shield 66 and the source contact 54 are one contiguous region of highly conductive material with an uninterrupted ohmic contact from above dielectric material 74 all the way to the surface of active layer 42. As such, the combination of the gate shield 66 and the source contact 54 can be conceptualized as a single source contact.

In general, the source contact 54 and the drain contact 56 enable electrical connections to the high-side LDFET 32 from other circuitry that may or may not be integrated with the LDFET on the same integrated circuit. Source region 46 can be electrically coupled to source contact 54 via a silicide layer formed on the surface of source region 46. More generally, the source region 46 can be coupled to the source contact 54 using any process that forms an ohmic or non-rectifying contact between the two regions of the structure. The connection between the drain contact 56 and the drain region 52 can comprise any of the variations described above with reference to source contact 54 and source region 46. The source contact 54 and the drain contact 56 can comprise a metal, metal alloy, metal silicide, or an electrically conductive semiconductor material such as doped polysilicon. Example metals, metal alloys, and metal silicides can each comprise copper, tungsten, molybdenum, and aluminum.

In the example shown in FIG. 3, some of the elements of the low-side LDFET portion 34 of the active layer 42 function in similar ways as the corresponding elements of the high-side LDFET portion 32 of the active layer 42. In this regard, the functionally similar elements of the low-side LDFET 34 will be labeled with reference numbers of the corresponding elements of the high-side LDFET that are followed by an apostrophe. For example, the drain region of the low-side LDFET 34 that corresponds to the functionally similar drain region 52 of the high-side LDFET 32 is labeled with reference number 52'. Thus, the low-side LDFET 34 includes the following elements: source region 46', doped region 48', LDD region 50' with a heavier doped extension region 49' that are formed in a doped region 51', drain region 52', source contact 54', drain contact 56', body region 60', deep well region 62', gate shield 66', gate electrode 68', and dielectric material 70', 72'.

In this example, the source contact 54' of the low-side LDFET 34 not only extends from above the active layer 42, through the source and doped regions 46', 48' to the deep well region 62', but it also extends through the deep well region 62' and the buried dielectric layer 44 and into the substrate 45. In this way, the source contact 54' of the low-side LDFET 34 provides a source-down electrical connection to the substrate 45 and thereby to the substrate contact 40, which corresponds to the ground node for the high power semiconductor switch circuit 10.

The second front-side electrical contact 84 (the phase node) electrically interconnects the source contact 54 of the high-side LDFET with the drain contact 56' of the low-side LDFET and, thereby, forms a common node for the source region 46 of the high-side LDFET 32 and the drain region 52' of the low-side LDFET 34. It is noted that the buried dielectric layer 44 and the dielectric isolation barrier 47 electrically isolate the high-side LDFET 32 from the substrate 45 to prevent the formation of a common node with the source contact 54' of the low-side LDFET 34 during operation of the power switch circuit 10.

The semiconductor die 30 is mounted on and within portions of the leadframe 320 of the IC package 300. As shown, the first front-side electrical contact 82 of the semiconductor die 30 is electrically coupled to and physically mounted to the electrical connector 75*b*, the second front-side electrical contact 84 is electrically coupled to and physically mounted to the electrical connector 75c, the clip 35 is electrically coupled to and physically mounted to the back-side electrical contact 40 of the semiconductor die 30, and the clip 35 is electrically coupled to and physically mounted to the electrical connector 75a. Additional electrical connections between the controller die 22 and the semiconductor die, similar to those shown in FIG. 2A-C, are made, but are omitted in FIG. 3 for simplicity.

The controller back-side electrical contact 81 of the controller die 22 is electrically coupled to and physically mounted to the clip 35. As mentioned above, the clip 35 is advantageously placed in between, and is coupled to, the semiconductor die 30 and the controller die 22 to facilitate heat transport away from those parts. Metal layers (e.g., the first front-side electrical contact 82 and the second front-side electrical contact 84) shown in FIG. 3 generally represent multiple metal layers that route connections as needed, including top metal layers for semiconductor die pads and additional metal layers between the semiconductor die pads and the insulating material (e.g., 74) or the active layer (e.g., 42). Some metal layers, connections, bond-wires, or other features have been omitted for simplicity. Intervening metal layers, conductive adhesive, copper pillars, solder bumps, or other metal bonding structures may be present. The simplified diagrammatic cross-sectional side view shows only a single transistor "finger" for simplicity. In some embodiments, multiple transistor fingers are connected in parallel to increase the power handling capability of the embodied circuit and to reduce total resistance as required by the application of the embodied circuit. The semiconductor die 30 is inverted or in a flip-chip configuration, so the "top"/"frontside" and the "bottom"/"backside" of the semiconductor die 30 are shown on the bottom and top, respectively, in the drawing.

Figure 4:
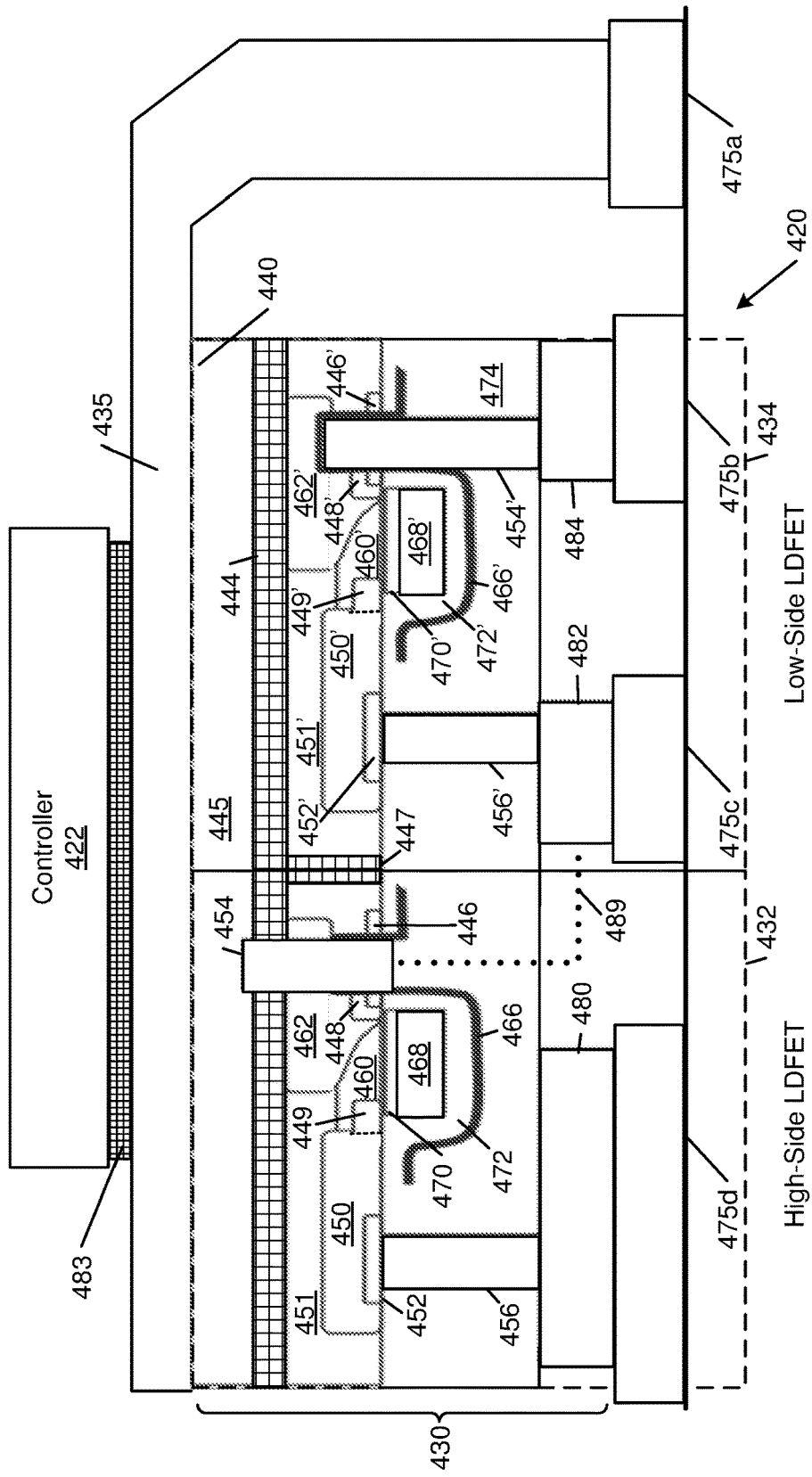
FIG. 4 is a diagrammatic cross-sectional of a simplified example of a portion of an integrated circuit package, in accordance with some embodiments.

FIG. 4 shows a simplified diagrammatic cross-sectional side view of a portion an integrated circuit (IC) package 400 including of a leadframe 420, in accordance with some embodiments. The portion of the leadframe 420 shown generally includes electrical connectors 475a-d. Other portions of the leadframe 420 have been omitted for simplicity. For example, perimeter package leads similar to the perimeter package leads 291a-h may be part of the leadframe 420.

The IC package 400 includes a semiconductor die 430 (similar to the semiconductor die 30 of FIG. 3) that has a first front-side electrical contact 480, a second front-side electrical contact 482, and a third front-side electrical contact 484. The IC package 400 also includes an electrically conductive clip ("clip") 435, a controller die 422 (similar to the controller die 22 of FIG. 3), and electrically insulating and thermally conducting material 483. Portions of the IC package 400 are similar to portions of the IC packages 200 discussed with reference to FIGS. 2A-C. For example: the clip 435 is similar to the clip 235, and electrical connectors 475a-d are similar to the electrical connectors 275a-c.

In the example embodiment shown, the semiconductor die 430 embodies the high power semiconductor switch circuit 10 of FIG. 1. In one example configuration, the first front-side electrical contact 480 of the high-side LDFET 432 corresponds to the input node 23 of the switch circuit 10 (see FIG. 1), a substrate contact 440 corresponds to the phase node 16 of the switch circuit 10, and the third front-side electrical contact 484 corresponds to the ground node of the switch circuit 10.

Some of the elements of the high-side LDFET 32 of the semiconductor die 30, and of the leadframe 320, shown in FIG. 3 function in similar ways as the corresponding elements of the high-side LDFET 432 and leadframe 420 shown in FIG. 4. In this regard, the functionally similar elements of the high-side LDFET 432 are labeled with the reference numbers of the corresponding elements of the high-side LDFET of FIG. 3 preceded by the number "4". For example, the drain region of the high-side LDFET 432 of FIG. 4 that corresponds to the functionally similar drain region 52 of the high-side LDFET 32 of FIG. 3 is labeled with reference number "452". Additionally, the electrical connector 475a of FIG. 4 is similar to the electrical connector 75a of FIG. 3.

The high-side LDFET 432 includes the following elements: source region 446, doped region 448, LDD region 450 with a heavier doped extension region 449 that are formed in a doped region 451, drain region 452, source contact 454, drain contact 456, body region 460, deep well region 462, gate shield 466, gate electrode 468, dielectric material 470, 472 and insulating material 474. In addition, the functionally similar elements of the low-side LDFET 434 are labeled with the reference numbers of the corresponding elements of the high-side LDFET 432 followed by an apostrophe. Thus, the low-side LDFET 434 includes the following elements: source region 446', doped region 448', LDD region 450' with a heavier doped extension region 449' that are formed in a doped region 451', drain region 452', source contact 454', drain contact 456', body region 460', deep well region 462', gate shield 466', gate electrode 468', and dielectric material 470', 472'.

In the example embodiment shown, the drain contact 456' of the low-side LDFET 434 and the source contact 454 of the high-side LDFET 432 are electrically connected by the second front-side electrical contact 482 (e.g. an electrical conductor) that includes an out-of-plane portion 489. In addition, the source contact 454 of the high-side LDFET 432 not only extends from above the active layer, through the source and doped regions 446, 448 to the deep well region 462, but it also extends through the deep well region 462 and the buried dielectric layer 444 and into the wafer substrate 445. In this way, the source contact 454 of the high-side LDFET 432 provides a source-down electrical connection to the substrate 445 and thereby to the substrate contact 440 for the phase node 16 of the high power semiconductor switch circuit 10. It is noted that the buried dielectric layer 444 and the dielectric isolation barrier 447 electrically isolate the low-side LDFET 434 from the substrate 445 to prevent the formation of a common node with the source contact 454 of the high-side LDFET 432 during operation of the power switch circuit.

The semiconductor die 430 is mounted on a portion of the leadframe 420. As shown, the first front-side electrical contact 480 is electrically coupled to and physically mounted to the electrical connector 475d of the leadframe 420, the second front-side electrical contact 482 is electrically coupled to and physically mounted to the electrical connector 475c, and the third front-side electrical contact 484 is electrically coupled to and physically mounted to the electrical connector 475b. The clip 435 is electrically coupled to and physically mounted to the back-side electrical contact 440 of the semiconductor die 430 and is electrically coupled to and physically mounted to the electrical connector 475a. Additionally, the controller die 422 is physically mounted to the clip 435, but is substantially electrically isolated from the clip 435 by the electrically insulating material 483. That is, a back-side electrical contact of the controller die 422 is not electrically coupled to the clip 435 in the embodiment shown. Additional electrical connections between the controller die 422 and the semiconductor die, similar to those shown in FIG. 2A-C, are made, but are omitted in FIG. 4 for simplicity. Alternatively, in some embodiments, where the substrate contact 440 corresponds to the phase node 16 of the switch circuit and is electrically coupled to the clip 435, the electrical connector 475c is optional or not included.

As mentioned above, the clip 435 is advantageously placed in between, and is coupled to, the semiconductor die 430 and the controller die 422 to facilitate heat transport away from those parts. Metal layers (e.g., the front-side electrical contacts 480, 482 and 484) shown in FIG. 4 generally represent multiple metal layers that route connections as needed, including top metal layers for semiconductor die pads and additional metal layers between the semiconductor die pads and the insulating material (e.g., 474) or the active layer. Some metal layers, connections, bond-wires, or other features have been omitted for simplicity. Intervening metal layers, conductive adhesive, copper pillars, solder bumps, or other metal bonding structures may be present. The semiconductor die 430 is inverted or in a flip-chip configuration, so the "top"/"frontside" and the "bottom"/"backside" of the semiconductor die 430 are shown on the bottom and top, respectively, in the drawing.

Figure 5:
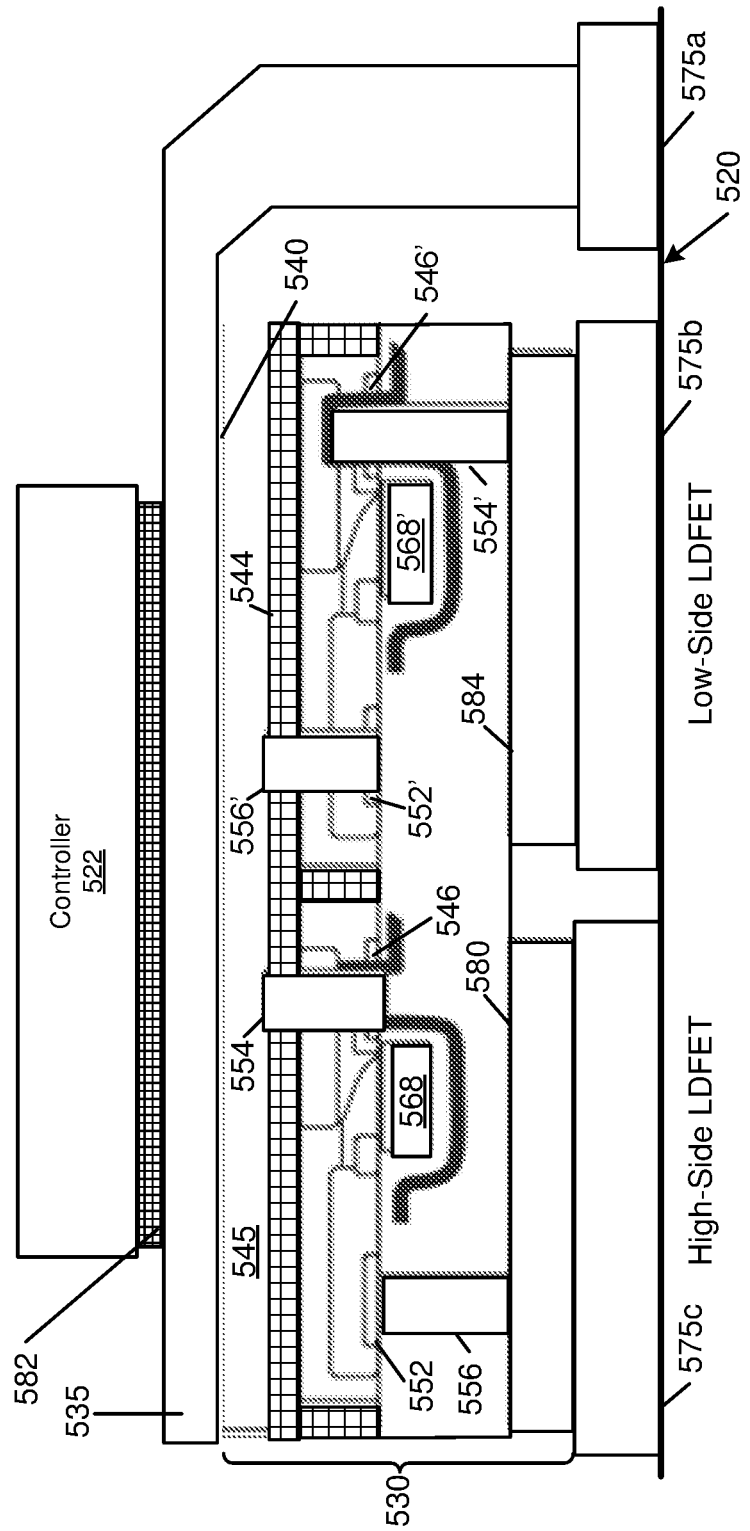
FIG. 5 is a diagrammatic cross-sectional of a simplified example of a portion of an integrated circuit package, in accordance with some embodiments.

FIG. 5 shows a simplified diagrammatic cross-sectional side view of a portion of an integrated circuit (IC) package 500 including a leadframe 520, in accordance with some embodiments. The portion of the leadframe 520 shown generally includes electrical connectors 575a-c. Other portions of the leadframe 520 have been omitted for simplicity. For example, perimeter package leads similar to the perimeter package leads 291a-h of FIG. 2A may be part of the leadframe 520. The IC package 500 also includes a semiconductor die 530 having a first front-side electrical contact 580 and a second front-side electrical contact 584, an electrically conductive clip ("clip") 535, a controller die 522, and electrically insulating and thermally conducting material 582. Portions of the IC package 500 are similar to portions of the IC packages 200 discussed with reference to FIGS. 2A-C. For example: the clip 535 is similar to the clip 235, and electrical connectors 575a-c are similar to the electrical connectors 275a-c.

In the example embodiment shown, the semiconductor die 530 embodies the high power semiconductor switch circuit 10 of FIG. 1. In one example, the first front-side contact 580 of the high-side LDFET is connected to the input node ($V_{IN}$) of the switch circuit 10 (see FIG. 1), a substrate contact 540 is connected to the phase node 16 ($V_{PHASE}$) of the switch circuit 10, and the second front-side contact 584 is connected to the ground node (GND) of the switch circuit 10. The substrate contact 540 corresponds to the phase node of the switch circuit 10.

In this example, some of the elements of the high-side LDFET 32 of the semiconductor die 30 shown in FIG. 3 function in similar ways as the corresponding elements of the high-side LDFET shown in FIG. 5. In this regard, the functionally similar elements of the high-side LDFET of FIG. 5 are labeled with the reference numbers of the corresponding elements of the high-side LDFET of FIG. 3 preceded by the number "5". For example, the drain region of the high-side LDFET of FIG. 5 that corresponds to the functionally similar drain region 52 of the high-side LDFET 32 of FIG. 3 is labeled with reference number "552". Similarly, functionally similar elements of the leadframe 520 of FIG. 5 are labeled with the reference numbers of the corresponding elements of the leadframe 320 of FIG. 3 preceded by the number "5". Thus, the high-side LDFET includes the following elements: source region 546, drain region 552, source contact 554, drain contact 556, and gate electrode 568. In addition, the functionally similar elements of the low-side LDFET are labeled with the reference numbers of the corresponding elements of the high-side LDFET followed by an apostrophe. Thus, the low-side LDFET shown in FIG. 5 includes the following elements: source region 546', drain region 552', source contact 554', drain contact 556', and gate electrode 568'.

In this example, using a process that supports formation of both source and drain substrate contacts, both the high-side source contact 554 and low-side drain contact 556' are fabricated as substrate contacts that extend through the buried dielectric layer 544 to the substrate 545. Thus, instead of using a front-side contact to connect the high-side source region 546 to the low-side drain region 552' as in the example shown in FIG. 4, this implementation of the high power semiconductor switch circuit 10 uses two substrate contacts 554 and 556' to connect the high-side source region 546 and the low-side drain region 552', respectively, to the phase node ($V_{PHASE}$). In this way, the number of front-side connections is reduced from three to two.

As shown, the first front-side electrical contact 580 is electrically coupled to and physically mounted to the electrical connector 575c of the leadframe 520, the second front-side electrical contact 584 is electrically coupled to and physically mounted to the electrical contact 575b, the clip 535 is electrically coupled to and physically mounted to the back-side electrical contact 540 of the semiconductor die 530, and the clip 535 is electrically coupled to and physically mounted to the electrical connector 575a. Additionally, the controller die 522 is physically mounted to the clip 535, but is substantially electrically isolated from the clip 535 by the electrically insulating material 582. However, other electrical connections between the controller die 522 and the semiconductor die 530 (e.g. to gate electrode 568/568'), omitted for simplicity in FIG. 5, may exist. The semiconductor die 530 is inverted or in a flip-chip configuration, so the "top"/"frontside" and the "bottom"/"backside" of the semiconductor die 530 are shown on the bottom and top, respectively, in the drawing.

As mentioned above, the clip 535 is advantageously placed in between, and is coupled to, the semiconductor die 530 and the controller die 522 to facilitate heat transport away from those parts. Metal layers (e.g., the first front-side contact 580 and the second front-side electrical contact 584) shown in FIG. 5 generally represent multiple metal layers that route connections as needed, including top metal layers for semiconductor die pads and additional metal layers between the semiconductor die pads and the insulating material or the active layer as mentioned above for the metal layers in other embodiments. Some metal layers, connections, bond-wires, or other features have been omitted for simplicity. Intervening metal layers, conductive adhesive, copper pillars, or other metal bonding structures may be present.

Figure 6:
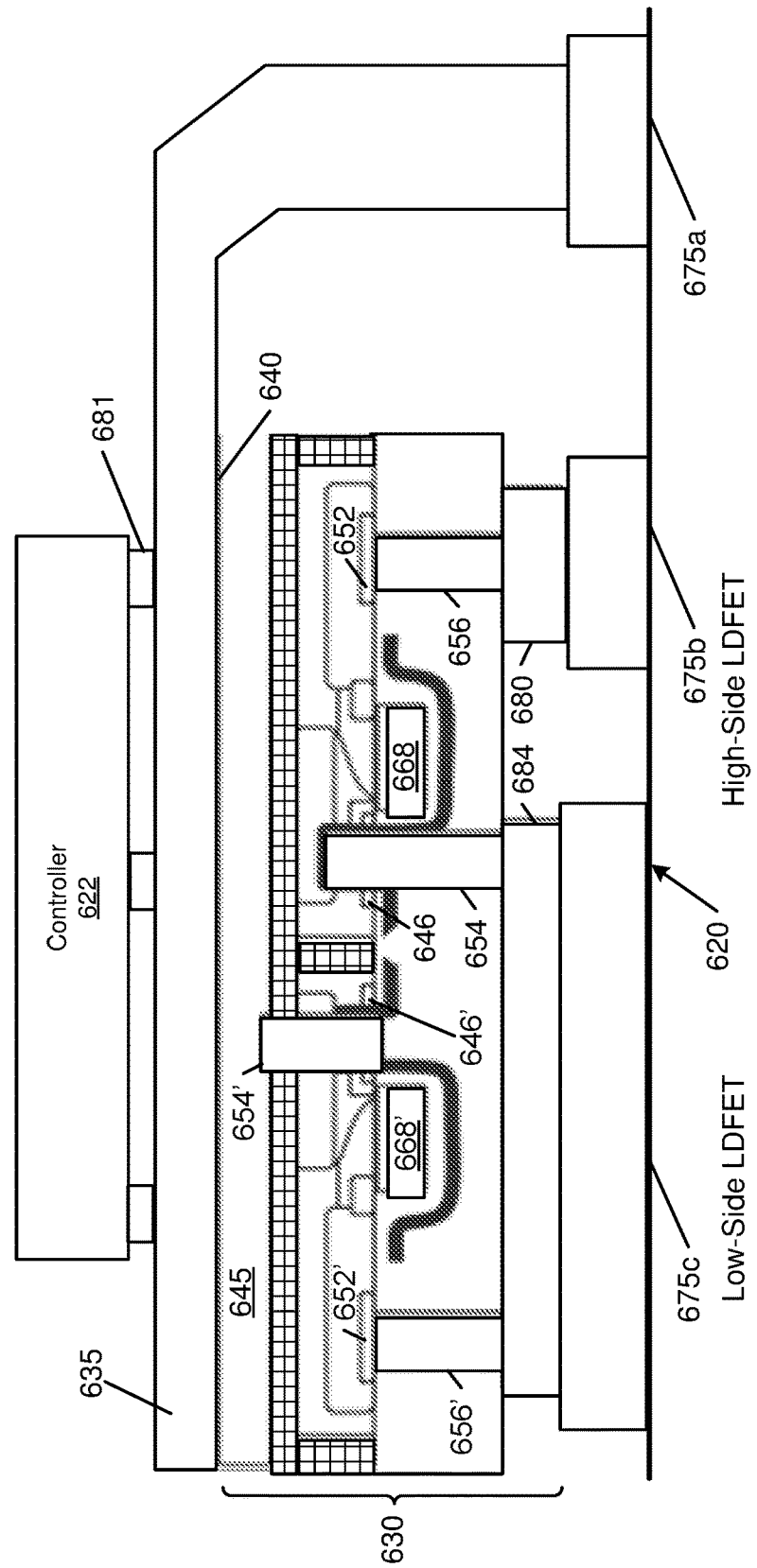
FIG. 6 is a diagrammatic cross-sectional of a simplified example of a portion of an integrated circuit package, in accordance with some embodiments.

FIG. 6 shows a simplified diagrammatic cross-sectional side view of a portion of an integrated circuit (IC) package 600 including a leadframe 620, in accordance with some embodiments. The portion of the leadframe 620 shown generally includes electrical connectors 675a-c. Other portions of the leadframe 620 have been omitted for simplicity. For example, perimeter package leads similar to the perimeter package leads 291a-h of FIG. 2A may be part of the leadframe 620. The IC package 600 also includes a semiconductor die 630 having a first front-side electrical contact 680 and a second front-side electrical contact 684. The IC package 600 also includes an electrically conductive clip ("clip") 635, and a controller die 622 having a back-side electrical contact 681. Portions of the IC package 600 are similar to portions of the IC packages 200 discussed with reference to FIGS. 2A-C. For example: the clip 635 is similar to the clip 235, and electrical connectors 675a-d are similar to the electrical connectors 275a-c.

In the example embodiment shown, the semiconductor die 630 embodies the high power semiconductor switch circuit 10 of FIG. 1. In one example configuration, the first front-side contact 680 of the high-side LDFET is connected to the input node ($V_{IN}$) of the switch circuit 10 (see FIG. 1), the second front-side contact 684 is connected to the phase node ($V_{PHASE}$) of the switch circuit 10, and a source contact 654', contacting substrate 645, is connected by the clip 635 through a backside contact 640 to the ground node (GND) of the switch circuit 10.

Some of the elements of the high-side LDFET 32 of the semiconductor die 30 shown in FIG. 3 function in similar ways as the corresponding elements of the high-side LDFET shown in FIG. 6. In this regard, the functionally similar elements of the high-side LDFET of FIG. 6 are labeled with the reference numbers of the corresponding elements of the high-side LDFET of FIG. 3 preceded by the number "6". For example, the drain region of the high-side LDFET of FIG. 6 that corresponds to the functionally similar drain region 52 of the high-side LDFET 32 of FIG. 3 is labeled with reference number "652". Thus, the high-side LDFET includes the following elements: source region 646, drain region 652, source contact 654, drain contact 656, and gate electrode 668. In addition, the functionally similar elements of the low-side LDFET are labeled with the reference numbers of the corresponding elements of the high-side LDFET followed by an apostrophe. Thus, the low-side LDFET shown in FIG. 6 includes the following elements: source region 646', drain region 652', source contact 654', drain contact 656', and gate electrode 668'.

As shown, the first front-side electrical contact 680 is electrically coupled to and physically mounted to the electrical connector 675b, the second front-side electrical contact 684 is electrically coupled to and physically mounted to the electrical contact 675c, the clip 635 is electrically coupled to and physically mounted to the back-side electrical contact 640 of the semiconductor die 630, and the clip 635 is electrically coupled to and physically mounted to the electrical connector 675a. Additionally, the controller die 622 is physically mounted to the clip 635 and is electrically coupled to the clip 635 by the controller back-side electrical contact 681.

As mentioned above, the clip 635 is advantageously placed in between, and is coupled to, the semiconductor die 630 and the controller die 622 to facilitate heat transport away from those parts. Metal layers (e.g., the contacts 680 and 684) shown in FIG. 6 generally represent multiple metal layers that route connections as needed, including top metal layers for semiconductor die pads and additional metal layers between the semiconductor die pads and the insulating material or the active layer as mentioned above for the metal layers in other embodiments. Some metal layers, connections, bond-wires, or other features have been omitted for simplicity. Intervening metal layers, conductive adhesive, copper pillars, solder bumps, or other metal bonding structures may be present. The semiconductor die 630 is inverted or in a flip-chip configuration, so the "top"/"frontside" and the "bottom"/"backside" of the semiconductor die 630 are shown on the bottom and top, respectively, in the drawing.

Figure 7A:
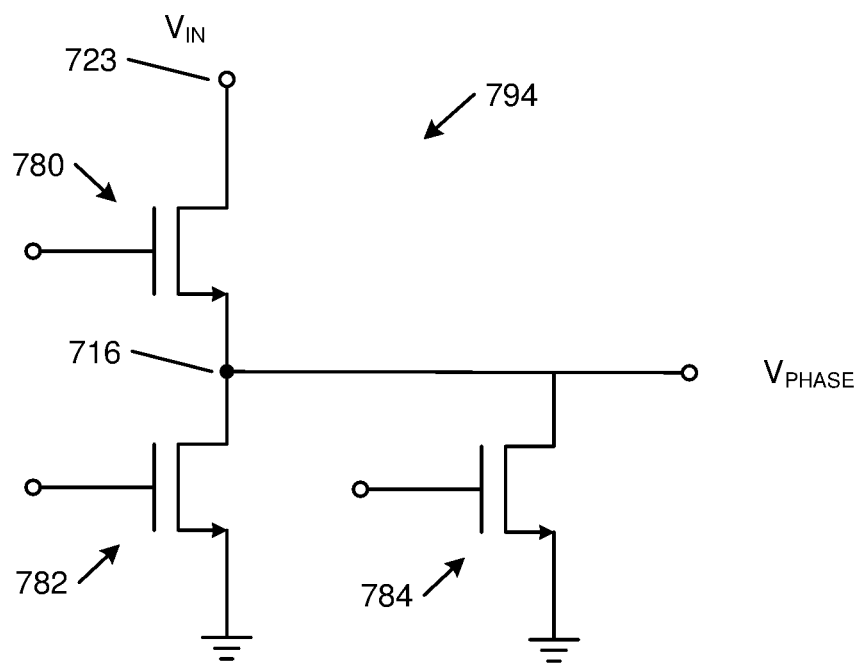
FIG. 7A is a circuit diagram of an example of a high power semiconductor switch incorporating some embodiments.

FIG. 7A shows an example of a high power semiconductor switch circuit 794 that includes a high-side field effect transistor (FET) 780, a first low-side FET 782, and a second low-side FET 784. The source of the high-side FET 780 is coupled to the drain of the first low-side FET 782 and to the drain of the second low-side FET 784 at a phase node 716.

Figure 7B:
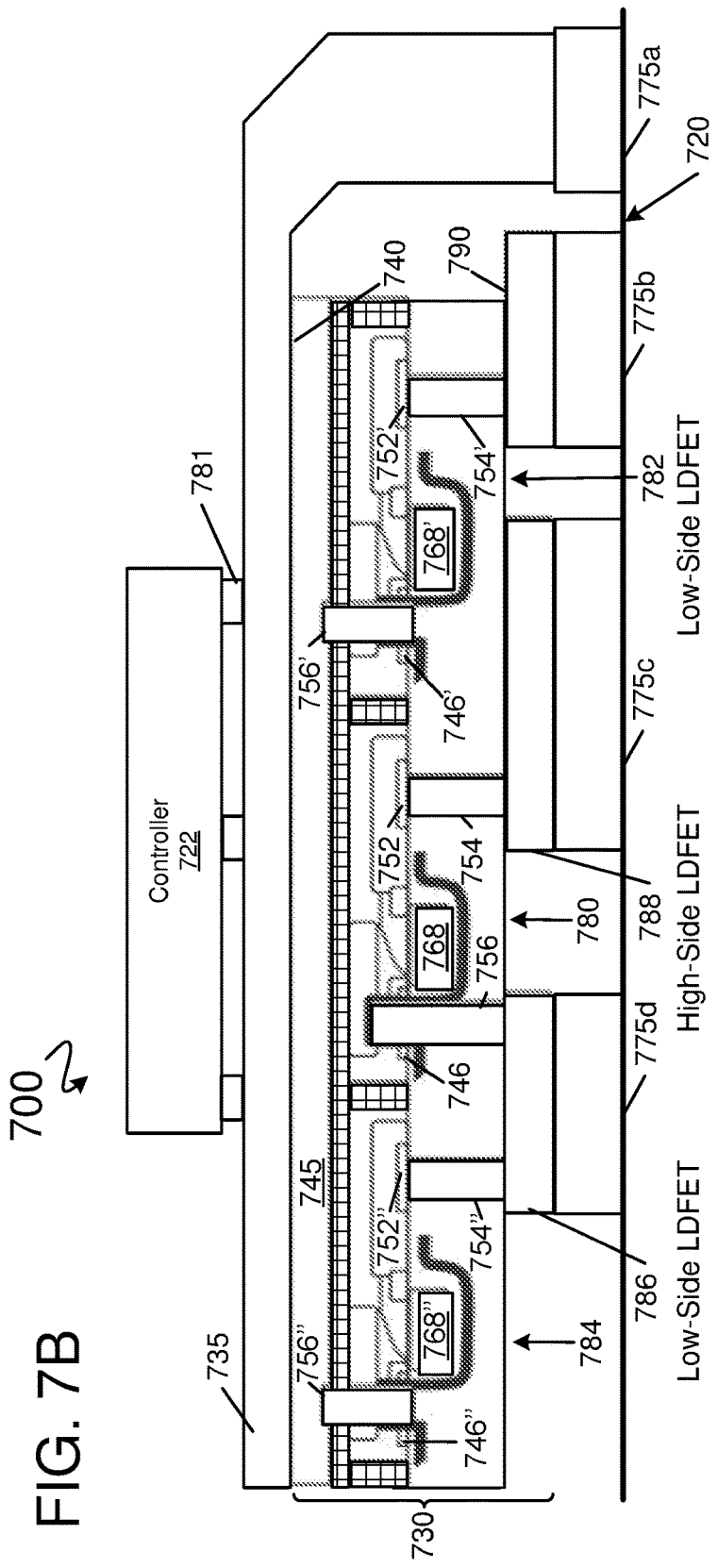
FIG. 7B is a diagrammatic cross-sectional of a simplified example of a portion of an integrated circuit package, in accordance with some embodiments.

FIG. 7B shows a simplified diagrammatic cross-sectional side view of a portion of an integrated circuit (IC) package 700 that includes a leadframe 720 embodying the high power switch circuit 794 of FIG. 7A, in accordance with some embodiments. The portion of the leadframe 720 shown generally includes electrical connectors 775a-d. Other portions of the leadframe 720 have been omitted for simplicity. For example, perimeter package leads similar to the perimeter package leads 291a-h may be part of the leadframe 720. The IC package 700 also includes a semiconductor die 730 that has a first front-side electrical contact 786, a second front-side electrical contact 788, and a third front-side electrical contact 790. The IC package 700 also includes an electrically conductive clip ("clip") 735, and a controller die 722 that has a back-side electrical contact 781. Portions of the IC package 700 are similar to portions of the IC packages 200 discussed with reference to FIGS. 2A-C. For example: the clip 735 is similar to the clip 235, and electrical connectors 775a-d are similar to the electrical connectors 275a-c.

In the example embodiment shown, the semiconductor die 730 embodies the high power semiconductor switch circuit 794 that includes the one high-side LDFET 780 and the two low-side LDFETs 782 and 784. In one example configuration, the first front-side contact 786 connects a source contact 756 of the high-side LDFET 780 and a drain contact 754" of the low-side LDFET 784 to the phase node 716 ($V_{PHASE}$) of the switch circuit 794 (see FIG. 7A), the second front-side contact 788 connects a drain contact 754 of the high-side LDFET 780 to the input node 723 ($V_{IN}$) of the switch circuit 794, and the third front-side contact 790 connects a drain contact 754' of the low-side LDFET 782 to the phase node ($V_{PHASE}$). In some embodiments, the first front-side contact 786 and the third front-side contact 790 are electrically coupled to each other out of plane to the cross-section shown in FIG. 7B.

Some of the elements of the high-side LDFET 32 of the semiconductor die 30 shown in FIG. 3 function in similar ways as the corresponding elements of the high-side LDFET 780 shown in FIG. 7B. In this regard, the functionally similar elements of the high-side LDFET 780 of FIG. 7B are labeled with the reference numbers of the corresponding elements of the high-side LDFET of FIG. 3 preceded by the number "7". For example, the drain region of the high-side LDFET 780 of FIG. 7B that corresponds to the functionally similar drain region 52 of the high-side LDFET 32 of FIG. 3 is labeled with reference number "752". Thus, the high-side LDFET 780 includes the following elements: source region 746, drain region 752, drain contact 754, source contact 756, and gate electrode 768. In addition, the functionally similar elements of the low-side LDFET 782 are labeled with the reference numbers of the corresponding elements of the high-side LDFET followed by an apostrophe. Thus, the low-side LDFET 782 shown in FIG. 7B includes the following elements: source region 746', drain region 752', drain contact 754', source contact 756', and gate electrode 768'. Similarly, the functionally similar elements of the low-side LDFET 784 are labeled with the reference numbers of the corresponding elements of the high-side LDFET followed by a double apostrophe. Thus, the low-side LDFET 784 shown in FIG. 7B includes the following elements: source region 746", drain region 752", drain contact 754", source contact 756", and gate electrode 768".

In the example embodiment shown, the high-side source region 746 and the adjacent low-side drain region 752" are interconnected by the first front-side contact 786 and the high-side source contact 756 and the low-side drain contact 754". By using substrate contacts 756' and 756" for connecting the source regions 746' and 746", respectively, to the ground node (GND), a larger metal area is available for the front-side phase node contact 790 for the low-side drain region 752' to enable the out-of-plane resistance to be reduced.

As shown, the first front-side electrical contact 786 is electrically coupled to and physically mounted to the electrical connector 775d, the second front-side electrical contact 788 is electrically coupled to and physically mounted to the electrical connector 775c, the third front-side electrical contact 790 is electrically coupled to and physically mounted to the electrical connector 775b, the clip 735 is electrically coupled to and physically mounted to the back-side electrical contact 740 of the semiconductor die 730, and the clip 735 is electrically coupled to and physically mounted to the electrical connector 775a. Alternatively, in some embodiments in which the first front-side contact 786 and the third front-side contact 790 are electrically coupled to each other out of plane to the cross-section shown in FIG. 7B, one of the electrical connectors 775b or 775d is optional or not included. Additionally, the controller die 722 is physically mounted to the clip 735 and is electrically coupled to the clip 735 by the controller back-side electrical contact 781.

As mentioned above, the clip 735 is advantageously placed in between, and is coupled to, the semiconductor die 730 and the controller die 722 to facilitate heat transport away from those parts. Metal layers (e.g., the contacts 786, 788, 790) shown in FIG. 7B generally represent multiple metal layers that route connections as needed, including top metal layers for semiconductor die pads and additional metal layers between the semiconductor die pads and the insulating material or the active layer as mentioned above for the metal layers in other embodiments. Some metal layers, connections, bond-wires, or other features have been omitted for simplicity. Intervening metal layers, conductive adhesive, copper pillars, or other metal bonding structures may be present. The semiconductor die 730 is inverted or in a flip-chip configuration, so the "top"/"frontside" and the "bottom"/"backside" of the semiconductor die 730 are shown on the bottom and top, respectively, in the drawing.

Though examples with two and three LDFETs integrated into a single power semiconductor die have been shown, numerous variations in the structures and arrangements of the constituent LDFETs that can be used to implement integrated LDFET devices are possible. In addition, two or more of these individual LDFET structures may be combined with one another to create additional integrated LDFET circuit embodiments. Any number of transistors and/or transistor fingers may be monolithically integrated in the semiconductor die 730. For example, multiple power blocks (each with their own independent high side and low side transistors) could coexist within the semiconductor die 730, each transistor sharing a common backside potential (Ground or Vin).

FIG. 8 shows a simplified example of a method 800 for packaging a flip chip oriented semiconductor device in an integrated circuit (IC) package having a leadframe, in accordance with some embodiments. A leadframe of an IC package is provided at step 805. In some embodiments, the leadframe has multiple electrical connectors and perimeter package leads, similar to the example portions of the leadframe 220 of an IC package 200 shown in FIGS. 2A-C. In general, the electrical connectors are respective strips of metal (e.g. 275a-c as shown in FIG. 2A), and are larger in at least one dimension than the perimeter package leads. In some embodiments, the electrical connector is a strip of metal having a thickness, a width and a length, where the length of the electrical connector is substantially longer than the width of the electrical connector.

At step 810, a single semiconductor die is formed or is provided. In general, the semiconductor die has a frontside and a backside, the frontside having one or more front-side electrical contacts and the backside having a back-side electrical contact. In some embodiments, the single semiconductor die is a die in accordance with those discussed herein, particularly with respect to FIG. 3 through FIG. 7B. In some embodiments, the single semiconductor die is of a power device and includes two or more LDFET transistors. In other embodiments, the single semiconductor die includes two or more transistors that are not LDFET transistors.

At step 815, the single semiconductor die is inverted and physically mounted to the leadframe of the IC package in a flip chip configuration. The one or more front-side electrical contacts of the single semiconductor die are electrically coupled to and physically mounted to respective electrical connectors of the leadframe. In some embodiments, one or more of the front-side electrical contacts of the single semiconductor die are electrically coupled to and physically mounted to respective perimeter package leads of the leadframe. For example, in some embodiments, the single semiconductor die includes two or more LDFETs, each having respective gate nodes coupled to respective front-side electrical contacts of the single semiconductor die. The front-side electrical contacts coupled to the respective gate nodes may be electrically coupled to respective perimeter package leads and, in some embodiments, may be physically mounted to the respective package leads.

At step 820, an electrically and thermally conductive clip is provided. In some embodiments, the electrically conductive clip is made of an electrically conductive material, such as copper, that also facilitates heat transport. In some embodiments, the electrically conductive clip has a minimum feature size of about 100 micrometers.

At step 825, a surface of the electrically conductive clip is electrically coupled to and physically mounted to an electrical contact of the leadframe (e.g. an electrical connector). In some embodiments, the electrical contact is a leadframe paddle. In other embodiments, the electrical contact is a strip of metal, the strip having a thickness, a width and a length, where the length is substantially longer than the width. In some embodiments, the electrical contact is also a heat-sink. At step 830, another surface of the electrically conductive clip is electrically coupled to and physically mounted to the back-side electrical contact of the single semiconductor die (e.g. using die-attach adhesive, solder paste, sintered silver, thermally conductive adhesive, or another appropriate technique).

At step 835, a controller die is formed or is provided, the controller die having a frontside and a backside. In some embodiments, the controller die has a back-side electrical contact (e.g. a ground contact). In other embodiments, the controller die does not have a backside electrical contact. In accordance with some embodiments, the controller die is electrically coupled to the semiconductor die and includes circuitry configured to control and synchronize the state (e.g. on/off, conducting/not-conducting) of transistors within the semiconductor die.

At step 840, the controller die is physically mounted to a surface of the electrically conductive clip (e.g. using die-attach adhesive, solder paste, sintered silver, thermally conductive adhesive, or another appropriate technique). The backside of the controller die may be mounted to the surface of the electrically conductive clip that is opposite the surface of the electrically conductive clip that is mounted to the back-side electrical contact of the single semiconductor die. However, other mounting configurations are possible. For example, the frontside of the controller die may be mounted to a surface of the electrically conductive clip. In some embodiments, the controller die is mounted to a surface of the electrically conductive clip such that the controller die is substantially electrically isolated from the electrically conductive clip. In other embodiments, the controller die is mounted to a surface of the electrically conductive clip such that the controller die is electrically coupled to the electrically conductive clip.

At step 845, other electrical connections within the IC package are made (e.g. using bond-wires). Such electrical connections include electrical connections between the controller die and the single semiconductor die, electrical connections between the controller die and the perimeter package leads, electrical connections between the controller die and the electrical connectors of the leadframe, electrical connections between the single semiconductor die and one or more of the perimeter package leads, and other electrical connections between the controller die and/or the single semiconductor die and the leadframe. Further steps in the method 800 may complete the IC package.

Reference has been made in detail to embodiments of the disclosed invention, one or more examples of which have been illustrated in the accompanying figures. Each example has been provided by way of explanation of the present technology, not as a limitation of the present technology. In fact, while the specification has been described in detail with respect to specific embodiments of the invention, it will be appreciated that those skilled in the art, upon attaining an understanding of the foregoing, may readily conceive of alterations to, variations of, and equivalents to these embodiments. For instance, features illustrated or described as part of one embodiment may be used with another embodiment to yield a still further embodiment. Thus, it is intended that the present subject matter covers all such modifications and variations within the scope of the appended claims and their equivalents. These and other modifications and variations to the present invention may be practiced by those of ordinary skill in the art, without departing from the scope of the present invention, which is more particularly set forth in the appended claims. Furthermore, those of ordinary skill in the art will appreciate that the foregoing description is by way of example only, and is not intended to limit the invention.

What is claimed is:

1. An apparatus comprising:
a leadframe having perimeter package leads, a first electrical connector, a second electrical connector, and a third electrical connector;
a single semiconductor die having a frontside and a backside, the backside having a back-side electrical contact, the frontside having a first front-side electrical contact, and a second front-side electrical contact, the first front-side electrical contact being electrically coupled to and physically mounted to the first electrical connector, and the second front-side electrical contact being electrically coupled to and physically mounted to the second electrical connector;
an electrically conductive clip having a first electrical contact surface, a second electrical contact surface, and a third electrical contact surface, the second electrical contact surface and the third electrical contact surface being on opposite sides of a portion of the electrically conductive clip, the first electrical contact surface being electrically coupled to and physically mounted to the third electrical connector, and the second electrical contact surface being electrically coupled to and physically mounted to the back-side electrical contact of the single semiconductor die; and
a top semiconductor die having a top semiconductor frontside, a top semiconductor backside and a top semiconductor back-side electrical contact, the top semiconductor backside being physically mounted to the third electrical contact surface of the electrically conductive clip
wherein:
the single semiconductor die comprises two or more transistors and a third front-side electrical contact, the first front-side electrical contact being electrically coupled to at least one of the two or more transistors, the second front-side electrical contact being electrically coupled to at least one of the two or more transistors, the third front-side electrical contact being electrically coupled to at least one of the two or more transistors, and the back-side electrical contact being electrically coupled to at least one of the two or more transistors.

2. The apparatus of claim 1, wherein:
the top semiconductor die is a controller die.

3. The apparatus of claim 1, wherein:
the single semiconductor die is a power semiconductor die.

4. The apparatus of claim 1, wherein:
the electrically conductive clip has a minimum feature size of about 100 micrometers.

5. The apparatus of claim 1, further comprising:
a first top semiconductor front-side electrical contact of the top semiconductor die, and a second top semiconductor front-side electrical contact of the top semiconductor die, the first top semiconductor front-side electrical contact being electrically coupled to a first set of the perimeter package leads, and the second top semiconductor front-side electrical contact being electrically coupled to the third front-side electrical contact of the single semiconductor die.

6. The apparatus of claim 5, wherein:
the two or more transistors comprise a high-side transistor and a low-side transistor;
the high-side transistor comprises a high-side source, a high-side drain, and a high-side gate;
the low-side transistor comprises a low-side source, a low-side drain, and a low-side gate; and
the third front-side electrical contact is electrically coupled to one or both of the high-side gate or the low-side gate.

7. The apparatus of claim 6, wherein:
the high-side transistor is a p-type transistor;
the low-side transistor is an n-type transistor;
the high-side gate is electrically coupled to the third front-side electrical contact;
the low-side gate is electrically coupled to the third front-side electrical contact; and
the high-side transistor and the low-side transistor are switched simultaneously using the third front-side electrical contact.

8. The apparatus of claim 1, wherein:
the two or more transistors comprise a high-side transistor and a low-side transistor;
the high-side transistor comprises a high-side source, a high-side drain, and a high-side gate;
the low-side transistor comprises a low-side source, a low-side drain, and a low-side gate;
the first front-side electrical contact is electrically coupled to the high-side drain;
the second front-side electrical contact electrically couples the high-side source and the low-side drain together; and
the back-side electrical contact is electrically coupled to the low-side source.

9. The apparatus of claim 8, wherein the top semiconductor back-side electrical contact is electrically coupled to the electrically conductive clip.

10. The apparatus of claim 1, wherein:
the leadframe comprises a fourth electrical connector;
the single semiconductor die comprises a fourth front-side electrical contact electrically coupled to and physically mounted to the fourth electrical connector;
the two or more transistors comprise a high-side transistor and a low-side transistor;
the high-side transistor comprises a high-side source, a high-side drain, and a high-side gate;
the low-side transistor comprises a low-side source, a low-side drain, and a low-side gate;
the first front-side electrical contact is electrically coupled to the high-side drain;
the second front-side electrical contact electrically couples the high-side source and the low-side drain together;
the back-side electrical contact is electrically coupled to the high-side source; and
the fourth front-side electrical contact is electrically coupled to the low-side source.

11. The apparatus of claim 10, wherein the top semiconductor back-side electrical contact is substantially electrically isolated from the electrically conductive clip.

12. The apparatus of claim 1, wherein:
the two or more transistors comprise a high-side transistor and a low-side transistor;
the high-side transistor comprises a high-side source, a high-side drain, and a high-side gate;
the low-side transistor comprises a low-side source, a low-side drain, and a low-side gate;
the first front-side electrical contact is electrically coupled to the high-side drain;
the back-side electrical contact electrically couples the high-side source and the low-side drain together; and
the second front-side electrical contact is electrically coupled to the low-side source.

13. The apparatus of claim 12, wherein the top semiconductor back-side electrical contact is substantially electrically isolated from the electrically conductive clip.

14. The apparatus of claim 1, wherein:
the two or more transistors comprise a high-side transistor and a low-side transistor;
the high-side transistor comprises a high-side source, a high-side drain, and a high-side gate;
the low-side transistor comprises a low-side source, a low-side drain, and a low-side gate;
the first front-side electrical contact is electrically coupled to the high-side drain;
the second front-side electrical contact electrically couples the high-side source and the low-side drain together; and
the low-side source is electrically coupled to the back-side electrical contact.

15. The apparatus of claim 14, wherein the top semiconductor back-side electrical contact is electrically coupled to the electrically conductive clip.

16. The apparatus of claim 1, wherein:
the leadframe comprises a fourth electrical connector;
the single semiconductor die comprises a fourth front-side electrical contact electrically coupled to and physically mounted to the fourth electrical connector;
the two or more transistors comprise a high-side transistor, a low-side transistor, and a second low-side transistor;
the high-side transistor comprises a high-side source, a high-side drain, and a high-side gate;
the low-side transistor comprises a low-side source, a low-side drain, and a low-side gate; and
the second low-side transistor comprises a second low-side source, a second low-side drain, and a second low-side gate;
wherein:
the first front-side electrical contact electrically couples the high-side source and the second low-side drain together;
the second front-side electrical contact is electrically coupled to the high-side drain;
the fourth front-side electrical contact is electrically coupled to the low-side drain; and
the back-side electrical contact electrically couples the low-side source and the second low-side source together.

17. The apparatus of claim 16, wherein the top semiconductor back-side electrical contact is electrically coupled to the electrically conductive clip.

18. The apparatus of claim 1, wherein the top semiconductor back-side electrical contact is electrically coupled to the electrically conductive clip.

19. The apparatus of claim 1, wherein the top semiconductor back-side electrical contact is substantially electrically isolated from the electrically conductive clip.

20. A method comprising:
providing a leadframe having perimeter package leads, a first electrical connector, a second electrical connector, and a third electrical connector;
forming a single semiconductor die having a frontside and a backside, the backside having a back-side electrical contact, the frontside having a first front-side electrical contact, and a second front-side electrical contact;
electrically coupling and physically mounting the first front-side electrical contact to the first electrical connector;
electrically coupling and physically mounting the second front-side electrical contact to the second electrical connector;
providing an electrically conductive clip having a first electrical contact surface, a second electrical contact surface and a third electrical contact surface, the second electrical contact surface and the third electrical contact surface being on opposite sides of a portion of the electrically conductive clip;
electrically coupling and physically mounting the first electrical contact surface of the electrically conductive clip to the third electrical connector;

electrically coupling and physically mounting the second electrical contact surface of the electrically conductive clip to the back-side electrical contact of the single semiconductor die;

providing a top semiconductor die having a top semiconductor frontside, a top semiconductor backside and a top semiconductor back-side electrical contact; and physically mounting the top semiconductor backside to the third electrical contact surface of the electrically conductive clip wherein:

the single semiconductor die comprises two or more transistors and a third front-side electrical contact, the first front-side electrical contact being electrically coupled to at least one of the two or more transistors, the second front-side electrical contact being electrically coupled to at least one of the two or more transistors, the third front-side electrical contact being electrically coupled to at least one of the two or more transistors, and the back-side electrical contact being electrically coupled to at least one of the two or more transistors.

21. The method of claim 20, wherein:
the top semiconductor die is a controller die.

22. The method of claim 20, wherein:
the single semiconductor die is a power semiconductor die.

23. The method of claim 20, wherein the electrically conductive clip is substantially electrically isolated from the top semiconductor back-side electrical contact.

* * * * *